(12) United States Patent
Cappuccino et al.

(10) Patent No.: US 10,254,322 B2
(45) Date of Patent: Apr. 9, 2019

(54) SYSTEM AND METHOD FOR THE MEASUREMENT AND PREDICTION OF THE CHARGING EFFICIENCY OF ACCUMULATORS

(71) Applicant: CALBATT S.R.L., Rende (IT)

(72) Inventors: Gregorio Cappuccino, Rende (IT); Francesco Antonio Amoroso, Rende (IT)

(73) Assignee: CALBATT S.R.L., Rende (CS) (IT)

( * ) Notice: Subject to any disclaimer, the term of this patent is extended or adjusted under 35 U.S.C. 154(b) by 1519 days.

(21) Appl. No.: 14/029,304

(22) Filed: Sep. 17, 2013

(65) Prior Publication Data

US 2014/0081585 A1    Mar. 20, 2014

(30) Foreign Application Priority Data

Sep. 18, 2012 (IT) .............................. RM2012A0446

(51) Int. Cl.
*G06F 17/40* (2006.01)
*G06F 19/00* (2018.01)
(Continued)

(52) U.S. Cl.
CPC ......... *G01R 27/02* (2013.01); *G01R 31/3624* (2013.01); *G01R 31/3634* (2013.01);
(Continued)

(58) Field of Classification Search
CPC ............... G01R 27/02; G01R 31/3624; G01R 31/3634; H01M 10/44; G06F 19/00; G06F 17/40
(Continued)

(56) References Cited

U.S. PATENT DOCUMENTS 3,321,613 A * 5/1967 Searle .................... G07C 3/005
702/182
5,789,924 A 8/1998 Okada
(Continued)

FOREIGN PATENT DOCUMENTS

WO    WO-2011109343    9/2011

OTHER PUBLICATIONS

Koning et al., Modeling battery efficiency with parallel branches, 35th Annual IEEE Power Electronics Specialists Conference, 2004, 141-147, IEEE, Aachen, Germany.

*Primary Examiner* — Yoshihisa Ishizuka
(74) *Attorney, Agent, or Firm* — Hershkovitz & Associates, PLLC; Abe Hershkovitz

(57) ABSTRACT

The invention concerns a method comprising two fundamental steps. The first one is an innovative process of characterization of the energetic efficiency performed during a charging process of an accumulator, whereby one derives a series of information concerning: the dependency of the electric parameters of the accumulator on the state of charge; the dependency of the efficiency of the charging system on the voltage and current at the output of the charging system. The second step of the proposed method is a process of data calculation for the prediction of the energetic efficiency, wherein one simulates one or more charging processes. The method can be realized by means of a charging system able to perform both a standard process for charging the accumulator and a process of characterization of the energetic efficiency, and a process of prediction of the energetic efficiency.

14 Claims, 8 Drawing Sheets

(51) Int. Cl.
    *G01R 27/02*    (2006.01)
    *G01R 31/36*    (2019.01)
    *H01M 10/44*    (2006.01)

(52) U.S. Cl.
    CPC ............. *H01M 10/44* (2013.01); *G06F 17/40* (2013.01); *G06F 19/00* (2013.01)

(58) Field of Classification Search
    USPC .......................................................... 702/65
    See application file for complete search history.

(56) References Cited

U.S. PATENT DOCUMENTS

| | | | |
|---|---|---|---|
| 6,236,214 B1* | 5/2001 | Camp, Jr. | .......... G01R 31/3648 320/132 |
| 6,832,171 B2 | 12/2004 | Barsoukov et al. | |
| 8,489,264 B2* | 7/2013 | Morita | ................ B60L 11/1851 320/136 |
| 2006/0273761 A1 | 12/2006 | Arai et al. | |
| 2009/0296432 A1 | 12/2009 | Chapuis | |
| 2009/0309416 A1 | 12/2009 | Bose et al. | |
| 2010/0250038 A1 | 9/2010 | Morita et al. | |
| 2011/0035084 A1 | 2/2011 | Er et al. | |
| 2011/0077879 A1 | 3/2011 | Paryani | |

\* cited by examiner

SYSTEM AND METHOD FOR THE MEASUREMENT AND PREDICTION OF THE CHARGING EFFICIENCY OF ACCUMULATORS

CROSS-REFERENCE TO RELATED APPLICATION

This application claims priority to Italian Application No. RM2012A000446 filed Sep. 18, 2012, the entire disclosure of which is incorporated herein by reference.

FIELD OF THE INVENTION

The present invention concerns a system and method for the measurement and prediction of the charging efficiency of accumulators.

More particularly, the invention is directed to a method that comprises an innovative process of characterization of the energetic efficiency carried out during a charging process of the accumulator, from which a series of information is obtained concerning the dependency of the electrical parameters of the accumulator on the state of charge (and possibly on the accumulator operating temperature) and concerning the dependency of the efficiency of the charging system on the voltage and current at the output of the charging system, and possibly also on the voltage at the input of the charging system (and possibly also on the operating temperature of the charging system). Moreover, the method allows a step of prediction of the energetic efficiency to be performed wherein one or more charging processes are simulated on the basis of the data obtained in the above characterization process. According to the invention, the method can be realized by a charging system able to perform both a standard charging process of the accumulator and a process of characterization of the energetic efficiency, as well as a process of prediction of the energetic efficiency. It is also possible to implement the method by a control system that can be used together with a conventional charging system.

Definitions

To facilitate the correct interpretation of the invention, some terms utilized in the description and claims are specified in the following.

Accumulator of electric energy: device able to receive in input electric energy, to store it in any form and to supply it as electric energy.

Charging process of an accumulator: process wherein electric energy is provided to an accumulator of electric energy.

Discharging process of an accumulator: process wherein the accumulator supplies electric energy.

Charging power of an accumulator: electric power supplied to an electric energy accumulator in a given time instant of the charging process.

Charging efficiency of an accumulator: ratio between the total amount of energy stored into an accumulator during the charging process and the electric total amount of energy supplied by the charging system to the same accumulator during the charging process.

Discharging efficiency of an accumulator: ratio between the total amount of electric energy supplied by an accumulator at its output terminals during the discharge and the total amount of energy lost by the same accumulator during the discharging process.

Charging system: system provided with an input section and an output section, the system drawing electric energy from an energy source by the input section and supplying electric energy to an accumulator by the output section.

Efficiency of the charging system: ratio between the electric power supplied at the output of the charging system and the electric power drawn in input by the same charging system.

Electric parameters of the accumulator: parameters of the equivalent electric circuit with which the accumulator can be modeled during the charging phase.

Framework of the Invention and State of the Art

The known charging process of an accumulator may be schematized as shown in FIG. 1. The energy is supplied by a source 101 to a charging system 102, which in turn supplies energy to the accumulator 103. Unfortunately, this process is characterized by energy losses into the charging system, into the accumulator and the related connection, losses that depend on the charging power. For example, in FIG. 2(A), the trend 201 of the charging efficiency of a typical Lithium-ion battery is shown as a function of the charging power, expressed in "C-rate":

$$C\text{-rate} = \frac{\text{Charging current } (A) \cdot 1h}{\text{Accumulator capacity } (Ah)}$$

The profile of FIG. 2(A) takes into account only the losses into the accumulator. However, also the efficiency of the charging system depends on the charging power. In the graph 202 of FIG. 2(B), a typical trend of the overall efficiency of the charging process (given by the product between the efficiency of the charging system and the charging efficiency of the accumulator) is shown as a function of the charging power (normalized with respect to the maximum power that can be supplied by the charging system and that can be absorbed by the accumulator).

Whilst the charging efficiency of the accumulator has typically a monotonically decreasing trend, the overall charging efficiency decreases in a substantial manner both for high and low levels of charging power. Hence, the fact of charging the accumulator in the slowest possible way is not synonymous with optimization of the overall charging efficiency. One derives therefore that knowing exactly the dependency of the overall charging efficiency on the charging power may be fundamental to consciously fix the charging power. Moreover, in scenarios providing for the use of a smart electric grid, this may allow systems and charging methods to be implemented that permit the optimization of the energetic efficiency of accumulators, such as for example the batteries of the electric vehicles, or dedicated batteries systems wherein the energy is to be accumulated from discontinuous renewable sources (solar, wind). Clearly, the relationship between the charging efficiency and power depends on the particular utilized charging system and accumulator.

In particular, it can be very useful for the end user to have at the user's disposal a system that is able, even before performing the charging process of the accumulator, to estimate the efficiency of the future charge as a function of the current state of charge of the accumulator, the final desired state of charge and the charging speed that is intended to be set.

Clearly, the relationship between the overall energetic efficiency of the charging process and the charging power depends on the particular utilized charging system and accumulator. A first solution could be that of obtaining this relationship once and for all by means of a characterization of the system in the production phase, and then storing it.

Unfortunately, performing this operation with traditional charging systems by simply adding energy measurement systems presents a series of remarkable difficulties. Indeed, whilst the efficiency of the charging system can be measured by measuring directly the energy flowing at the input and at the output ports of the charging system in any operational condition, a direct measurement of the energy losses in the charging process of the accumulator cannot be performed. To better understand this problem, reference is made to FIG. 3, which shows the energy flow in a charging process. The energy supplied by the source to the charging system 301 is indicated with $E_{in}$. This energy can be measured directly by measuring, by means of suitable devices, the voltage ($V_{in}$) and current ($I_{in}$) at the terminals of the input port of the charging system:

$$E_{in}(t) = \int_{t_0}^{t} V_{in}(\tau) I_{in}(\tau) d\tau.$$

Because of the losses into the charging system, the latter supplies an energy 302 $E_{sc} = \eta_{CH} E_{in}$, wherein $\eta_{CH}$ (<1) indicates the efficiency of the charging system. This energy can also be measured directly by measuring, by means of suitable devices, the voltage ($V_{out}$) and current ($I_{out}$) at the terminals of the output port of the charging system:

$$E_{sc}(t) = \int_{t_0}^{t} V_{out}(\tau) I_{out}(\tau) d\tau.$$

Hence, the efficiency of the charging system is directly the ratio between the two energies. Part of the energy $E_{sc}$ supplied by the charging system is dissipated within the accumulator, which stores an energy 303 equal to $E_{st} = \eta_{ac} E_{sc}$, wherein $\eta_{ac}$ indicates the charging efficiency of the accumulator which dissipates as heat the remaining part equal to $(1-\eta_{ac}) E_{sc}$.

As one of skill in the art can easily understand, if only devices for the measurement of voltage and current at the terminals of the accumulator are used, it is not possible to directly measure the energy really stored in the accumulator during the charging phase. Such information could be in some way obtained indirectly in the subsequent discharge phase of the accumulator, which will supply an energy $E_{oa} = \eta_{ad} E_{st}$ ($E_{oa} = \eta_{ac} \eta_{ad} E_{sc}$) wherein $\eta_{ad}$ indicates the discharging efficiency of the accumulator. This energy is directly measurable by a measurement of the voltage at the terminals of the accumulator ($V_A$) and the current that flows in the accumulator ($I_A$), being:

$$E_{oa}(t) = \int_{t_0}^{t} V_A(\tau) I_A(\tau) d\tau.$$

By the direct measurement of $E_{oa}$ and $E_{sc}$ it is possible to obtain the product between the charging efficiency and the discharging efficiency ($E_{oa}/E_{sc} = \eta_{ac} \eta_{ad}$) (the so-called "roundtrip efficiency"). In general, the two values of efficiency are different, so that it is not possible, in principle, to determine individually the charging efficiency and the discharging efficiency by a similar procedure. In any case, even admitting that the charging efficiency and the discharging efficiency are equal, there are other factors that complicate remarkably the estimation of the combined efficiency of charging system/accumulator.

Indeed, the charging efficiency of the accumulator at a parity of supplied energy may vary also as a function of the initial and final state of charge of the charging process, owing to the fact that the internal resistors of the accumulator (that cause the power dissipation) vary in general with the state of charge. Moreover, most parts of the accumulators utilized in the real applications (among which, for example, the lead acid and lithium batteries) are charged by a constant current phase, followed by a constant voltage phase, whose durations are strictly tied to the initial state of charge and the final desired one of the accumulator.

A further complication derives from the fact that the efficiency of the charging system also depends on the output voltage of the same charging system.

FIG. 4 shows the trend, as measured experimentally, of the efficiency of a charging system with varying output voltage and current.

Even supposing that the charging process is only performed at constant current, the output voltage of the charging system will vary during the charging process depending on the initial and final state of charge of the accumulator.

Due to the foregoing, if one wants to characterize the overall charging efficiency by simply measuring the energy absorbed by the source and the one stored in the accumulator, at least m·n complete accumulator charge/discharge cycles would be needed, wherein m represents the number of different charge currents to explore and n represents the number of different initial states of charge to explore.

It is clear that such a method would entail an enormous waste of time and energy for the determination of the relationship between charging efficiency and charging power.

Moreover, the described characterization method would provide accurate results only for the specific specimens of charging system and accumulator under examination and what is more, only in the live state that the same have at the moment of the characterization.

Indeed, with the above method, one could only determine an «average efficiency» of the charging system (measured as the ratio between the total energy supplied at the output and that altogether absorbed at the input of the charging system during the process) during each of the m·n charging processes. Therefore, such an efficiency measurement is strictly correlated to the specific accumulator connected during the characterization phase, which determines univocally the voltage-current pairs of the functioning of the charging system.

Therefore, the unavoidable ageing of the components (charging system and accumulator), or their partial substitution, will require the whole characterization process to be performed anew.

Some of the discussed problems may be solved by estimating the energetic efficiency of the accumulator by a model of the energy losses on the same accumulator, as proposed by Er et al. (patent no US 2011/0035084), de Koning et al. (Modeling battery efficiency with parallel branches, 2004), and Arai et al. (patent no US 2006/0273761, wherein a method for the measurement of the energetic efficiency is not illustrated, but rather, one for the measurement of the coulombic efficiency, meant as the ratio between the amount of energy actually stored and that absorbed by the accumulator). As a matter of practice, the accumulator may be modeled by an equivalent electric circuit, obtained by the interconnection of circuit elements selected from a group comprising voltage generators, current generators, resistors, capacitors, inductors, diodes and the like.

A typical equivalent circuit of an accumulator is that shown in FIG. 5 at 501. The circuit is composed by two resistors $R_1$ and $R_2$, a capacitor $C_2$ and an ideal battery $V_{ID}$. Typically, all the electric parameters of the equivalent circuit show a dependency on the state of charge (SOC) of the accumulator. The correct determination of the electric parameters of the model, i.e. the values to attribute to the above-mentioned circuit elements, allows an electric behavior nearly identical to that of the real accumulator to be re-created. The determination of the electric parameters is an operation that requires relatively short time-spans, and can be performed at any moment during the lifetime of the accumulator. Once such parameters are extracted, it is possible to determine in an accurate manner the charging efficiency of the accumulator for each admissible level of charging power by a suitable calculation algorithm. For example, by assuming that the accumulator is well described by the model in FIG. 5, the charging efficiency is determined by the energy absorbed by the ideal battery $V_{ID}$ and that dissipated on the resistors $R_1$ and $R_2$. This has the undeniable advantage of allowing the estimation of the efficiency of the accumulator by a circuital simulation of the system, without the necessity of physically discharging the accumulator to estimate the energy really inputted in the preceding charging phase.

There are different methods for the measurement of the equivalent electric parameters by which an accumulator can be modeled (see, e.g., T. Morita et al., patent no US 2010/0250038; T. Okada, U.S. Pat. No. 5,789,924; and E. Barsoukov et al., U.S. Pat. No. 6,832,171). One of these references discloses evaluating the time response of the voltage at the terminals of the accumulator to a current pulse, an operation performed by the known testers (see, e.g., Bertness, patent no WO 2011/109343). However, it is not possible to use such testers directly to evaluate the electric parameters of the accumulator with varying SOC unless one performs a discharge process of the accumulator (which is an inconvenient operation in terms of energy and time) simply to the end of sampling the parameters provided by the tester for different values of the SOC. Instead, the evaluation of the electric parameters with varying SOC may be performed easily if the charging system is able to pre-arrange suitable interruptions within a standard cycle of charging of the accumulator.

To this end, one can utilize more enhanced charging systems as proposed by the art, such as that proposed by Paryani (patent no US 2011/0077879), which is able to extract the electric parameters of the accumulator during the whole lifetime of the same accumulator to the end of evaluating its health state.

Once the electric parameters of the accumulator are obtained, it is possible to perform a circuital simulation of what happens on the battery, which would allow the charging efficiency of the accumulator in correspondence to a certain desired initial state of charge, final state of charge and charging time to be obtained, and therefore to multiply the efficiency obtained by the experimentally obtained efficiency of the charging system for those desired values of initial state of charge, final state of charge and charging time.

Unfortunately, although a charging system incorporating directly the solution just described would allow the estimation of the charging efficiency of the accumulator during the whole lifetime of the system to be updated, it would not solve the problem relevant to the estimation of the efficiency of the charging system, which would remain tied to the specific accumulator connected during the characterization of the same charging system. In other terms, whilst the phase of characterization of the accumulator efficiency would be enough easy, it would be necessary in any case to carry out m·n charging cycles (where m represents the number of different charge currents that one wants to explore and n represents the number of different initial states of charge that one wants to explore) to characterize the charging system each time the accumulator is changed or it is deemed necessary because of ageing of the same.

To avoid this remarkable loss of time (and electric energy), and to further improve the system, a model of the energy losses into the charging system in the time simulation concerning the behavior of the accumulator also could be utilized. Obviously, in order to do this, a model of the efficiency curves of the charging system with varying output voltage and current is needed (FIG. 4).

This principle underlays some systems proposed in the art which utilize mathematical models for the losses of power systems (ac/dc and dc/dc converters) to the end of optimizing dynamically the performances of the system (see, e.g., Chapuis, patent no US 2009/0296432; and Bose et al., patent no US 2009/309416).

The systems of this type are based on a characterization of the system that provides a measurement step wherein the efficiency of the system for different output voltages and currents (and possibly of other parameters such as the input voltage and the temperature) are determined. The number of measurements to be performed varies on the basis of the accuracy to be obtained. For example, with reference to FIG. 4, to determine the efficiency of the charging system for m output current values and n output voltage values, m·n measurement would be necessary. Surely this represents a less expensive procedure in terms of time with respect to performing m·n distinct charging processes. The fundamental problem is, however, that such a characterization process requires that the output of the charging system has to be disconnected from the accumulators and connected to a device that allows the charging system to work in any point of the space output voltage/output current. Therefore, such a characterization procedure is suitable to be carried out possibly in the production phase. Moreover, such characterization should be performed, because of the unavoidable production tolerances, on a sufficiently large sample if not for each produced system, which results in a remarkable increase of fabrication costs. Certainly, this method is not suitable to be used easily by the end user at any moment of the lifetime of the system.

By virtue of the foregoing, it appears that it is not possible to obtain a charging system that is able to update in a rapid and effective way the efficiency profile in real time for the whole life of the system by the union of the different existing systems in the art, as discussed above.

Accordingly, it is object of the present invention to provide a method for the characterization of the energetic efficiency of the group charging system/accumulator that allows the limits of the conventional systems to be overcome.

As it will be illustrated in the drawings and discussed in detail in the following description, the method according to the present invention can be implemented by an intelligent charging system able to measure the efficiency and possibly to optimize automatically the charging parameters in order to maximize the energetic efficiency of the system.

Obviously an intelligent charging system such as the one that will be illustrated and described could not solve the problem faced by a majority of the users who already have a charging system, in which case, it is impractical and uneconomical to substitute the whole still functioning system with a new one to have the possibility of easily measuring the efficiency of the accumulator. In these cases, it would be more economical and practical to be equipped with a simple measurement tool to be used in addition to the charging system already in use.

The present invention is directed to a suitable tool comprising a certain number of voltage and current sensors to perform the measurement of the efficiency of the charging system and a connection device, connected between the charging system 102 and the accumulator 103 (FIG. 1), able to temporarily disconnect the accumulator from the charging system and connect it to a suitable measurement device to the end of determining its electrical parameters with varying state of charge. However, such a solution is unfeasible because typically the commercial charging systems, as a precaution, automatically terminate the charging process when the accumulator is disconnected from the same charging system. The present invention has as object also of overcoming such a problem by introducing a further measuring system that will be discussed in detail in the following description.

OBJECT OF THE INVENTION

An object of the present invention is overcoming the limits of conventional systems by introducing a method of characterization of the energetic efficiency of the group charging system/accumulator that can be used easily during and for the whole lifetime of the charging system, when the accumulator is ageing, and even in case of substitution of the latter.

It is also an object of the present invention to provide a method for the characterization of the energetic efficiency of the charging process of an accumulator, as in the annexed claims.

It is a further object of the present invention to provide a method for the prediction of the energetic efficiency of the charging process of an accumulator, as in the annexed claims.

It is still further an object of the present invention of a charging system for accumulators of electric energy, as in the annexed claims.

It is further specific subject matter of the present invention of a charge control system for an accumulator of electric energy, as in the annexed claims.

BRIEF DESCRIPTION OF THE FIGURES

The invention will be now described by way of illustration but not by way of limitation, with reference to the drawings, wherein.

DETAILED DESCRIPTION OF THE EMBODIMENTS OF THE INVENTION

The following detailed description has the aim of illustrating the general principle and some alternative implementations of the invention, but it is not to be considered as limiting.

According to an aspect of the present invention, an innovative method is proposed that allows the overall performances in terms of energetic efficiency of the particular utilized charging-system/accumulator with varying charging parameters (charging power, initial state of charge, final state of charge, temperature, state of ageing) to be characterized easily, at any moment of the lifetime of the system.

The proposed method allows the information necessary to the characterization of the energetic efficiency to be obtained by means of a single process of characterization of the energetic efficiency (or in any case by a limited number of characterization processes) that consists of a phase of characterization of the charging system and a phase of characterization of the accumulator, that are per se realizable independently. Such phases of characterization are performed during an accumulator charging process on the basis of a determined number of measurements obtained by exploiting the natural evolution of the pair voltage/current at the terminals of the accumulator connected at the output of the charging system.

In order to explain the functioning of the method, reference is made to a standard charging algorithm wherein the charging process is composed by a first step at constant current (wherein the charging system behaves as a current generator) and a subsequent step at constant voltage (wherein the charging system behaves as a voltage generator), such an algorithm being utilized for most part by the accumulators on the market, such as for example the lead acid or Li-ion batteries.

The skilled person will recognize that this does not limit the general validity of the proposed method, which can be easily extended to charging algorithms that are different or used in other types of batteries.

Figure 1:
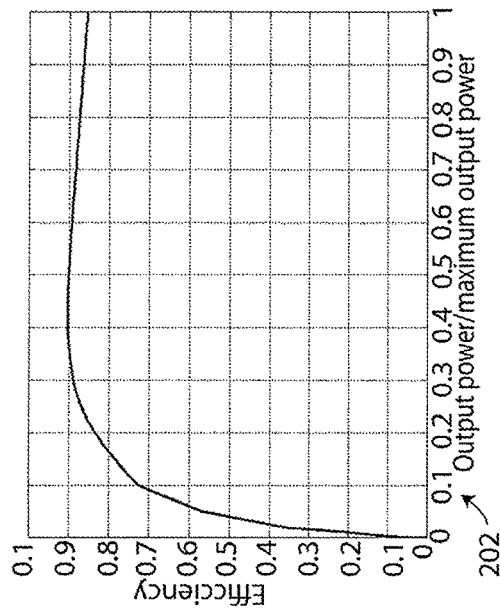
FIG. 1 shows a block diagram of the group charging-system/accumulator.
Figure 2A:
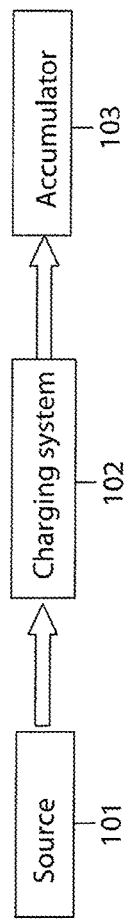
FIG. 2(A) shows a graph of the dependency of the charging efficiency on the charging power for a Li-ion battery.
Figure 2B:
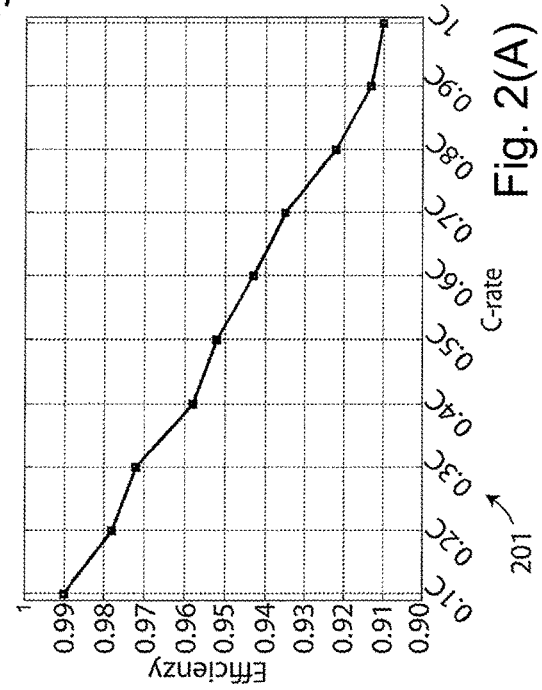
FIG. 2(B) shows a typical trend of the overall efficiency of the charging process as a function of the charging power.
Figure 3:
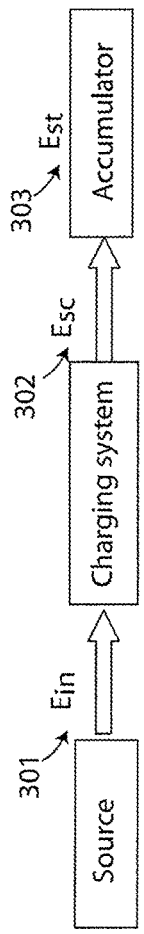
FIG. 3 shows the flow of energy in a charging process.
Figure 4:
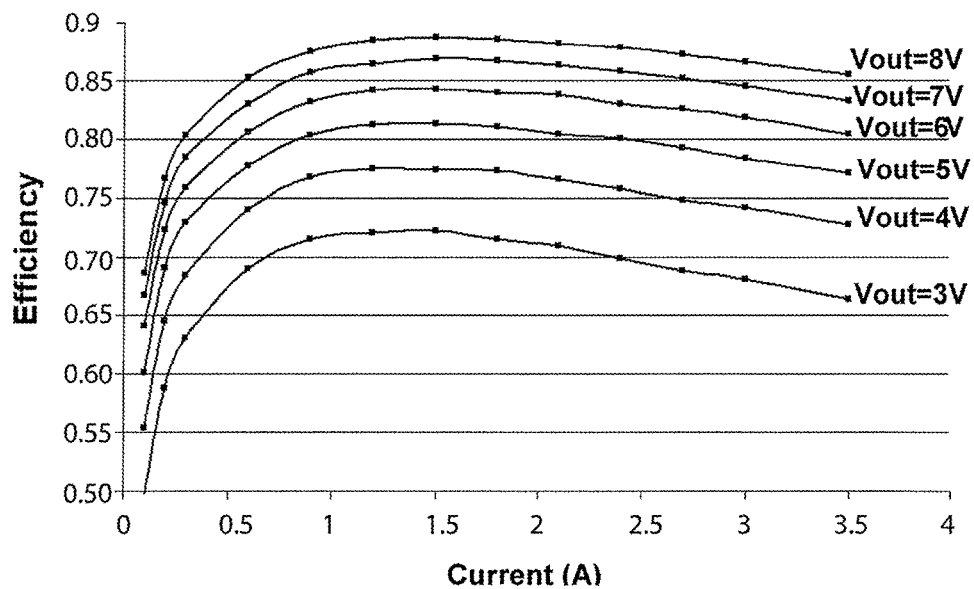
FIG. 4 shows the efficiency of the charging system with varying output voltage and current applied to the accumulator.
Figure 5:
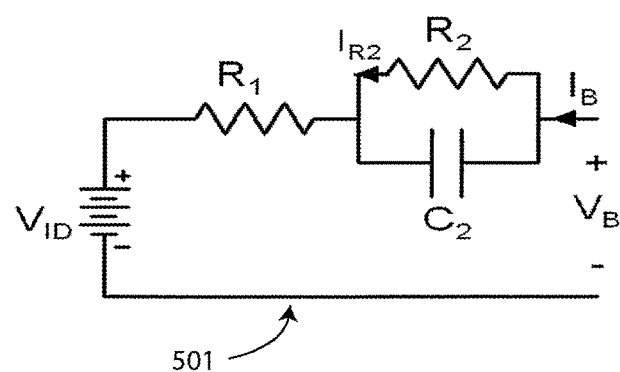
FIG. 5 shows a possible equivalent model of an accumulator.
Figure 6:
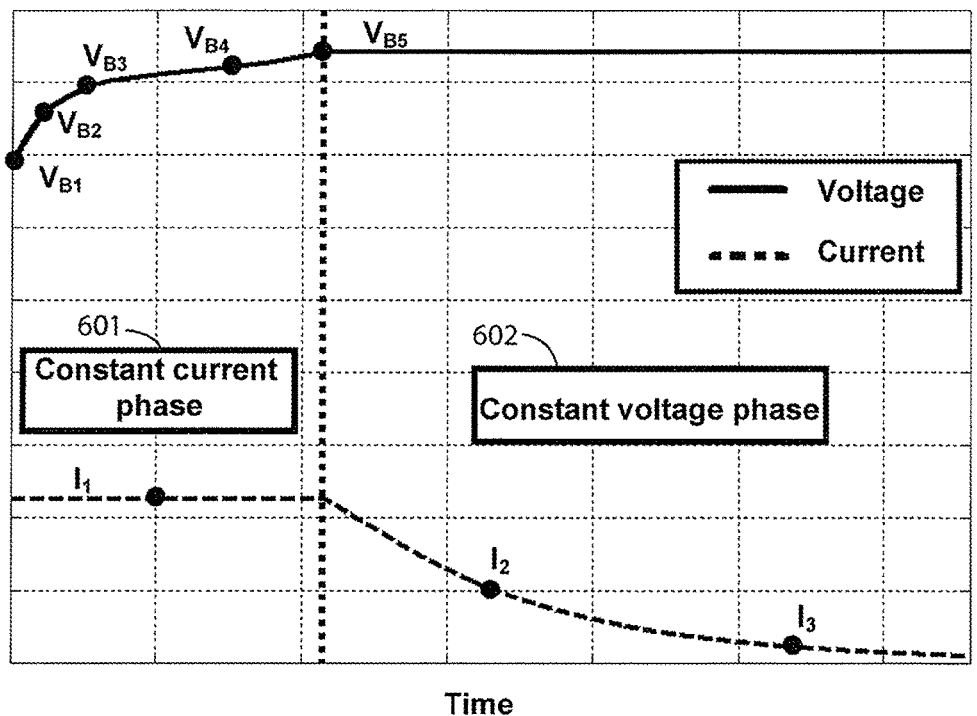
FIG. 6 shows a generic standard charging process composed by a step at constant current and a step at constant voltage.

The graph of FIG. 6 shows a typical trend of the voltage and current of an accumulator during a standard charging process composed by a step at constant current 601 and another one at constant voltage 602. As shown by the graph, in the step at constant current, the current at the output of the charging system does not vary (and is equal to the value indicated by $I_1$), whilst the voltage at the output of the charging system increases with an increasing state of charge of the accumulator (passing from an initial voltage $V_{B1}$ to a preset voltage $V_{B5}$, which is the one that will be set in the subsequent step, by the charging system, for the charge at constant voltage).

Figure 7:
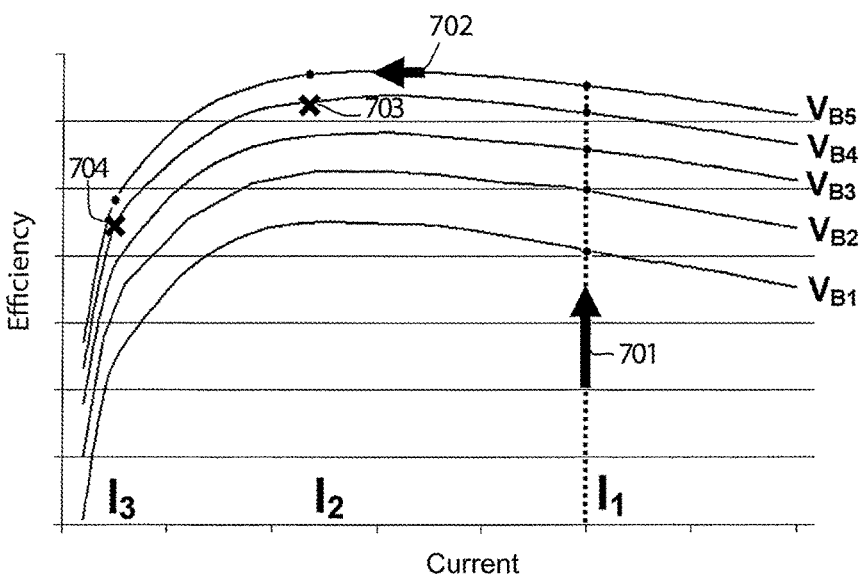
FIG. 7 shows a graph illustrating the principle underlying the characterization method that is subject matter of the present invention.

Hence, with reference to FIG. 7 (that gives a typical trend of the efficiency of the charging system with varying output current and voltage), it can be deduced that, in the step at constant current, the efficiency of the charging system naturally evolves along a trajectory 701 wherein the current outputting the system keeps constant (equal to $I_1$), whilst the voltage outputting the system increases with increasing state of charge of the accumulator (passing from $V_{B1}$ to $V_{B5}$).

Concerning the step of characterization of the charging system, this natural evolution of the voltage on the accumulator is exploited to perform a first step of measurements composed of a pre-determined number of measurements of the efficiency of the charging system during subsequent time intervals wherein the charging system each time provides a constant charging current $I_{ref}$ ($I_{ref}=I_1$ in the example at hand).

As it will be understood for the remainder of the description, the number of measurements performed during the different steps of the process of characterization within the charging process depends on the accuracy sought to characterize the efficiency of the system.

The above measurements performed at the same current $I_{ref}$ allow the relationship existing between the efficiency of the charging system and the output voltage to be extracted, that is obtained by an interpolation function $f^\eta_{Vout}$ of the measured points, i.e.:

$$\eta_{CH}(V_{out},I_{out})=f_{Vout}{}^\eta(V_{out},I_{ref}) \qquad (1)$$

Such a function (as well as the other functions utilized by the proposed method) can be selected in general from a set of functions comprising polynomial functions, splines and the like, such a choice not affecting the quality of the method but only the computational effort for the processing system and the accuracy of the obtained values.

During the step of charging at constant voltage, the efficiency of the charging system evolves instead naturally along a trajectory 702 wherein the voltage at the output of the system keeps constant (equal to $V_{B5}$ in the example at hand), whilst the current diminishes along time in correspondence to the increase of the state of charge of the accumulator.

This is particularly useful to perform a second step of measurements within the phase of characterization of the charging system. Such second step consists of a pre-determined number of measurements of the efficiency of the charging system at a reference voltage $V_{ref}$ ($V_{ref}=V_{B5}$ in the example) for different currents (in the example of FIG. 7 the number of measurements is arbitrarily chosen equal to three, carried out in correspondence to currents $I_1$, $I_2$, and $I_3$). By means of an interpolation of the measured points, one determines therefore an interpolating function flout that allows the efficiency of the charging system to be expressed for a generic current $I_{out}$ when the system output voltage is equal to the reference voltage $V_{ref}$:

$$\eta_{CH}(V_{ref},I_{out})=f_{Iout}{}^\eta(V_{ref},I_{out}) \qquad (2)$$

At this point, a step of extrapolation is performed utilizing a function $G^\eta_{Vout}$ to calculate, according to the relationship:

$$\eta_{CH}(V_{out},I_{out})=G_{Vout}{}^\eta[f_{Iout}{}^\eta(V_{ref},I_{out}),V_{out}], \qquad (3)$$

wherein $G^\eta_{Vout}$ is a function obtained starting from $f^\eta_{Iout}$ translating the latter starting from its value correspondence to the pair ($V_{ref}$, $I_{out}$) along the axis defined by the generic value $V_{out}$ by a quantity that is a function of the corresponding step of $f^\eta_{Vout}$ between $V_{ref}$ and $V_{out}$ when the output current of the charging system is equal $I_{ref}$, for example of a quantity exactly equal to the step.

As a matter of practice, $f^\eta_{Iout}$ is translated in the space defined by the triple comprising the pair ($V_{out}$, $I_{out}$) and a generic efficiency value, thus obtaining a function $$\eta_{CH}(V_{out},I_{out})$$

that gives an efficiency value for the generic pair ($V_{out}$, $I_{out}$).

It deals with a function that allows the values of the efficiency of the charging system in correspondence to a generic pair voltage/current ($V_{out}$, $I_{out}$) even outside the trajectory followed in the space ($V_{out}$, $I_{out}$) by the accumulator during the process of characterization (in the example of FIG. 7 the two values of efficiency in correspondence to the pairs ($V_{B4}$, $I_2$) 703 e ($V_{B4}$, $I_3$) 704 are for example extrapolated). Although the values so obtained represent an extrapolation of the efficiency of the system in correspondence to the considered pairs ($V_{out}$, $I_{out}$), it deals with an approximation that is as accurate as the definition of the above functions $G^\eta_{Vout}$ and $f^\eta_{Iout}$ is accurate.

For example, physical considerations concerning the typical dissipation processes of charging systems show that the functions $G^\eta_{Vout}$ and $f^\eta_{Iout}$ can be conveniently defined as follows:

$$\begin{cases} f^\eta_{Iout}(V_{ref},I_{out}) = \dfrac{V_{ref} \cdot I_{out}}{V_{ref} \cdot I_{out} + P_0(V_{ref}) + \alpha_1(V_{ref}) \cdot I_{out} + \alpha_2(V_{ref}) \cdot I^2_{out}} \\ G^\eta_{Vout}[f^\eta_{Iout}(V_{ref},I_{out}),V_{out}] = f^\eta_{Iout}(V_{ref},I_{out}) + \beta_1 \cdot (V_{out} - V_{ref}) \end{cases} \qquad (4)$$

wherein $\beta_1$ is a constant real coefficient, and $P_0(V_{ref})$, $\alpha_1(V_{ref})$ and $\alpha_2(V_{ref})$ are coefficients assuming constant real values for a given value of such values being determined by means of at least two measurements performed in the first step of measurements and two measurements performed in the second step of measurements.

Obviously the disclosed characterization process is performed for a determined input voltage $V_{in}$ of the system (constant in case the input voltage is continuous current (dc) or with constant amplitude in case it deals with an alternate voltage (ac)). For applications wherein the input voltage of the charging system may vary (such as for example the charging of accumulators from solar panels), one can take into account the further impact of this quantity on the efficiency of the system.

To this end, the proposed method provides also for the possibility to perform a third step of measurements of the efficiency of the charging system in correspondence to a determined number of different values of voltage $V_{in}$ at the input terminals of the charging system (in the case of alternate sinusoidal voltages, for example, it may mean by variation of $V_{in}$ the variation of its effective value). In general, this third step of measurements can be performed within the phase of characterization of the charging system of just one process of characterization wherein variations of $V_{in}$ occur, or in a plurality of different processes of characterization performed in correspondence to different values of $V_{in}$. After the above mentioned third step of measurements one derives, by interpolation of the measured values of the efficiency of the charging system, an interpolating function $f^n_{Vin}$ that allows the efficiency of the charging system to be expressed for a generic value of $V_{in}$ and a pair $(V_{out}, I_{out})$ measured during the above third step of measurements. In this way, it is possible to calculate, similarly to the foregoing, according to the relationship:

$$\eta_{CH}(V_{in}, V_{out}, I_{out}) = G_{Vin}^n\{G_{Vout}^n[f_{Iout}^n(V_{ref}, I_{out}), V_{out}]\}, \quad (5)$$

a function that allows the values of the efficiency of the charging system (and consequently of the dissipated power) to be extrapolated in correspondence to a generic triple $(V_{in}, V_{out}, I_{out})$ even outside the trajectory followed into the space $(V_{in}, V_{out}, I_{out})$ during the process of characterization. The function $G^n_{Vin}$ is a function of translation in the space, in a way completely similar to the $G^n_{Vout}$.

Even in this case, the number of measurements of efficiency to be performed in the different steps depends on the mathematical model chosen for the efficiency of the system. Therefore, the choice of a suitable mathematical model may be important to simplify the characterization process.

For example, experimental results show that the following formulation for the efficiency function comes out to be particularly convenient to successfully characterize the system in a sufficiently accurate manner by a limited number of measurements:

$$\eta_{CH}(V_{in}, V_{out}, I_{out}) == \quad (6)$$
$$\frac{V_{out} \cdot I_{out}}{V_{out} \cdot I_{out} + K_0 + A_0 V_{in} + B_0 V_{out} + (K_1 + A_1 V_{in} - B_1 V_{out})I_{out} + (K_2 + A_2 V_{out} - B_2 V_{in})I_{out}^2}$$

In this relationship, $K_0$, $K_1$, $K_2$, $A_0$, $A_1$, $A_2$, $B_0$, $B_1$, $B_2$ are constant coefficients that can be derived by the interpolation of only nine values of efficiency of the charging system: two values measured in the first step of measurements of the charging system efficiency, two values measured in the second step of measurements of the charging system efficiency, three values measured in the third step of measurements and two values of efficiency determined in the step of extrapolation by using the function defined by the expression (3).

The following further simplification of the efficiency function allows the losses of the charging system instead to be characterized by just one process of characterization carried out at constant $V_{in}$ (at constant effective value in case of sinusoidal ac voltages):

$$\eta_{CH}(V_{in}, V_{out}, I_{out}) == \quad (7)$$
$$\frac{V_{out} \cdot I_{out}}{V_{out} \cdot I_{out} + K_0 + A_0(V_{in} + V_{out}) + [K_1 + A_1(V_{in} - V_{out})]I_{out} + [K_2 + A_2(V_{out} - V_{in})]I_{out}^2}$$

Indeed the coefficients $K_0$, $K_1$, $K_2$, $A_0$, $A_1$, $A_2$ present in the expression are derivable by interpolation of six values of efficiency of the charging system as obtained in the same characterization process: two values measured in the first step of measurements of the charging system efficiency, two values measured in the second step of measurements of the charging system efficiency, and two values determined by extrapolation by using the function in (3) without the necessity to resort to the measurements provided in the third step at different $V_{in}$.

This can be easily understood if the charging system efficiency is expressed as a function of the power $P_{DCH}$ dissipated by the charging system (according to the relationship $$\eta_{CH} = \frac{V_{out} \cdot I_{out}}{V_{out} \cdot I_{out} + P_{DCH}}),$$

and one considers the following formulation for $P_{DCH}$:

$$\begin{cases} P_{DCH}(V_{in}, V_{out}, I_{out}) = P_0(V_{in}, V_{out}) + \\ \alpha_1(V_{in}, V_{out}) \cdot I_{out} + \alpha_2(V_{in}, V_{out}) \cdot I_{out}^2 \\ P_0(V_{in}, V_{out}) = K_0 + A_0(V_{in} + V_{out}) \\ \alpha_1(V_{in}, V_{out}) = K_1 + A_1(V_{in} - V_{out}) \\ \alpha_2(V_{in}, V_{out}) = K_2 + A_2(V_{out} - V_{in}) \end{cases} \quad (8)$$

The coefficients $P_0$, $\alpha_1$ and $\alpha_2$ of the equation of $P_{DCH}$ for a given pair $(V_{in}, V_{out})$ may be obtained by means of three values measured in correspondence to three different current $I_{out}$. With reference to the efficiency curves of FIG. 7, the three points obtained in correspondence to the output currents $I_1$, $I_2$, $I_3$ and for $V_{out}=V_{B5}$ can be considered (and for a given value of $V_{in}$ that is constant in the analysis).

Once the efficiency in correspondence of these three points is known, the dissipated power can be determined, and the coefficients $P_0(V_{in}, V_{B5})$, $\alpha_1(V_{in}, V_{B5})$ and $\alpha_2(V_{in}, V_{B5})$ can be found by inverting the following equation system:

$$\begin{cases} P_{DCH}(V_{in}, V_{B5}, I_1) = P_0(V_{in}, V_{B5}) + \alpha_1(V_{in}, V_{B5}) \cdot I_1 + \alpha_2(V_{in}, V_{B5}) \cdot I_1^2 \\ P_{DCH}(V_{in}, V_{B5}, I_2) = P_0(V_{in}, B_{B5}) + \alpha_1(V_{in}, V_{B5}) \cdot I_2 + \alpha_2(V_{in}, V_{B5}) \cdot I_2^2 \\ P_{DCH}(V_{in}, V_{B5}, I_3) = P_0(V_{in}, V_{B5}) + \alpha_1(V_{in}, V_{B5}) \cdot I_3 + \alpha_2(V_{in}, V_{B5}) \cdot I_3^2 \end{cases} \quad (9)$$

The so determined values of $P_0$, $\alpha_1$ and $\alpha_2$ may therefore be utilized in expression (4) to determine the interpolating function $f^n_{Iout}$.

From the two points measured at current $I_1$ for voltages equal to $V_{B4}$ and $V_{B5}$, the coefficient $\beta_1$ instead can be found that allows the function $G^n_{Vout}$ to be expressed as shown in (4). At this point, once this relationship is known, the values of efficiency in correspondence to currents $I_2$ and $I_3$ and for $V_{out}=V_{B4}$ can be extrapolated by exploiting the following relationships according to the equation (3):

$$\eta_{CH}(V_{B4},I_2)=G_{Vout}\eta[f_{Iout}\eta(V_{B5},I_2),V_{B4}] \text{ and}$$

$$\eta_{CH}(V_{B4},I_3)=G_{Vout}\eta[f_{Iout}\eta(V_{B5},I_3),V_{B4}].$$

Once such efficiency values are known, it is possible to derive the corresponding values of dissipated power and find the coefficients $P_0(V_{in}, V_{B4})$, $\alpha_1(V_{in}, V_{B4})$ and $\alpha_2(V_{in}, V_{B4})$ by inverting the following system of equations (starting from the formulation of $P_{DCH}$ of the system (8) wherein one considers $V_{out}=V_{B4}$ and $I_{out}$ equal to $I_1$, $I_2$ and $I_3$)

$$\begin{cases} P_{DCH}(V_{in}, V_{B4}, I_1) = P_0(V_{in}, V_{B4}) + \\ \alpha_1(V_{in}, V_{B4}) \cdot I_1 + \alpha_2(V_{in}, V_{B4}) \cdot I_1^2 \\ P_{DCH}(V_{in}, V_{B4}, I_2) = P_0(V_{in}, V_{B4}) + \\ \alpha_1(V_{in}, V_{B4}) \cdot I_2 + \alpha_2(V_{in}, V_{B4}) \cdot I_2^2 \\ P_{DCH}(V_{in}, V_{B4}, I_3) = P_0(V_{in}, V_{B4}) + \\ \alpha_1(V_{in}, V_{B4}) \cdot I_3 + \alpha_2(V_{in}, V_{B4}) \cdot I_3^2 \end{cases} \quad (10)$$

At this point, the values of the coefficients $K_0, K_1, K_2, A_0, A_1, A_2$ to be utilized in the expression (7) for the efficiency can be obtained easily by inverting the following systems of equations:

$$\begin{cases} P_0(V_{in}, V_{B5}) = K_0 + A_0(V_{in} + V_{B5}) \\ P_0(V_{in}, V_{B4}) = K_0 + A_0(V_{in} + V_{B4}) \end{cases}; \quad (11)$$

$$\begin{cases} \alpha_1(V_{in}, V_{B5}) = K_1 + A_1(V_{in} - V_{B5}) \\ \alpha_1(V_{in}, V_{B4}) = K_1 + A_1(V_{in} - V_{B4}) \end{cases}; \text{ and} \quad (12)$$

$$\begin{cases} \alpha_2(V_{in}, V_{B5}) = K_2 + A_2(V_{B5} - V_{in}) \\ \alpha_2(V_{in}, V_{B4}) = K_2 + A_2(V_{B4} - V_{in}) \end{cases}. \quad (13)$$

Figure 8:
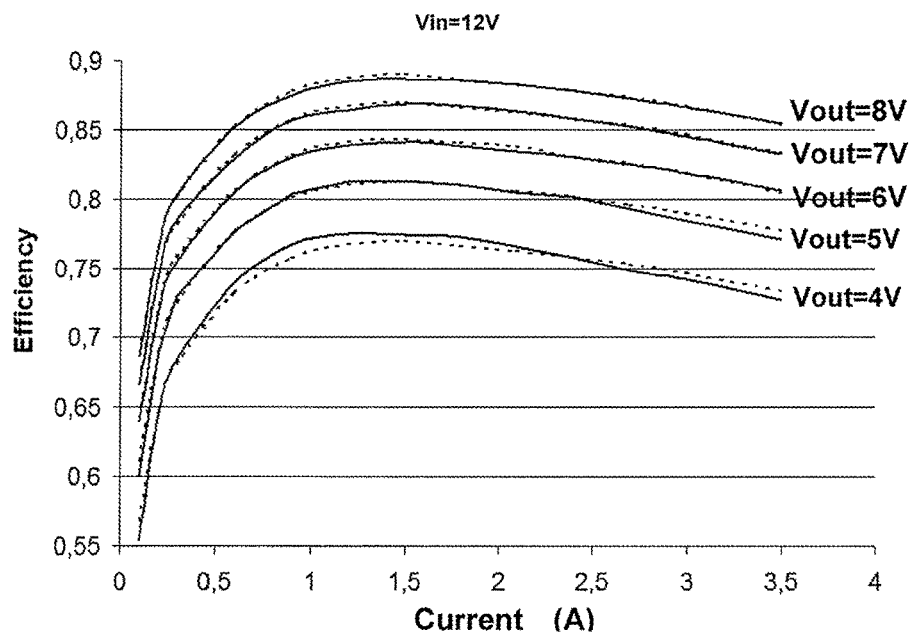
FIG. 8 shows the real efficiency (continuous line) and the efficiency reconstructed according to the invention (dashed line) of the charging system for different output current and voltage values and constant input voltage.
Figure 9:
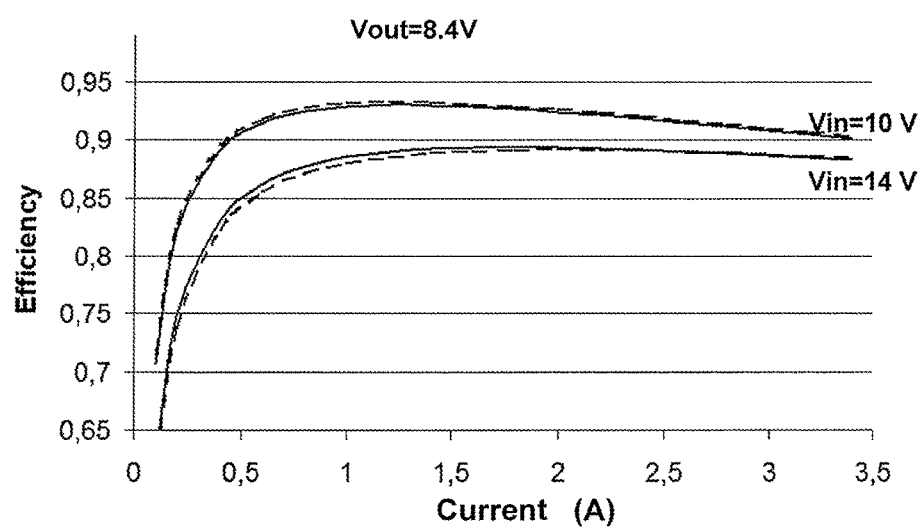
FIG. 9 shows the real efficiency (continuous line) and the efficiency reconstructed according to the invention (dashed line) of the charging system for different input voltage and current values and constant output voltage.

The accuracy that can be achieved in the phase of characterization of the charging system is stressed by the graphs in FIG. 8 and FIG. 9, which show the real efficiency curves of a charging system (continuous line) and those estimated by the proposed method (dashed line) for different values of $V_{in}$, $V_{out}$ and $I_{out}$.

Such curves have been obtained by a description of the efficiency expressed by the relationship in expression (7), whose coefficients have been determined by just one charging process as discussed above.

Obviously, the accuracy in the estimation of the relationship between efficiency of the system and the input voltage can always be increased by performing a pre-determined number (that is limited in any case) of characterization processes at different values of the input voltage (by exploiting the normal input voltage variations in the particular application or utilizing an ad-hoc voltage adjusting system interposed between the source and the input of the power section of the charging system).

Figure 10:
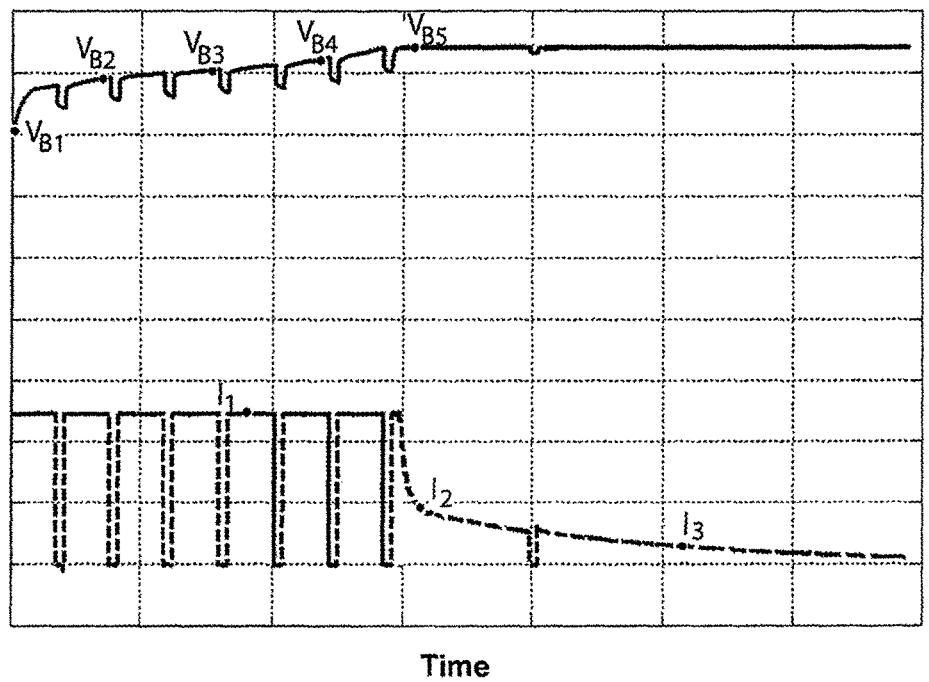
FIG. 10 shows a charging process according to the invention including a given number of steps of measurement of the charging system efficiency and steps of determination of the electrical parameters of the accumulator.

Besides the algorithm discussed above for determining the charging system efficiency, the proposed characterization process provides a phase of characterization of the accumulator consisting of a series of steps of determination of the electrical parameters of the same accumulator. These steps of determination of the parameters are performed whenever the state of charge is incremented by a pre-determined quantity, by applying a current waveform to the accumulator (as selected from a set of signals comprising impulsive, step, sinusoidal and similar signals) and evaluating the corresponding time response of the voltage on the same accumulator. In the preferred implementation, the steps of determination of the parameters are performed by setting to zero for a certain timespan the current supplied to the accumulator, and obtaining trends of the output voltage and current of the charging system during a characterization process that appear altogether as shown in FIG. 10.

Obviously, this must not be understood by way of limitation, because in some situations, obtaining an estimation of the above-mentioned parameters can even be done by exploiting the application of any other type of current and/or voltage waveform to the accumulator in the above-mentioned steps of determination of parameters, as for example the current and/or voltage waveform obtained naturally during the evolution of the charging process in the absence of further perturbation of the same charging process (for example of the type of the voltage and current waveforms shown in FIG. 6).

Once the electrical parameters of the accumulator (equivalent circuit) are known, the proposed method provides a process of prediction of the energetic efficiency consisting of one or more simulations of a pre-determined number of charging processes with different time trends of the charging power.

Every circuit simulation of the process of prediction of the energetic efficiency may be carried out at any instant subsequent to the above-mentioned characterization process, and consists of the following steps: determining the value of the initial state of charge of the accumulator connected to the charging system (for example by reading the open-circuit voltage and/or by counting the electric charge according the so-called Coulomb counting method), and starting from this value, simulating with a pre-determined timestep a charging process performed at a given charging power, and determining at each timestep ($t_k$) of the simulation: the state of charge (SOC($t_k$)), the electrical parameters of the accumulator as a function of SOC($t_k$), the voltage $V_{out}(t_k)$ and the current $I_{out}(t_k)$ on the accumulator, the power $P_{DA}(t_k)$ dissipated by the dissipative elements of the equivalent circuit of the accumulator and the power $P_{DCH}(t_k)$ dissipated by the charging system by using one of the functions $\eta_{CH}$ found by the characterization process. Finally, the overall efficiency of the charging process $\eta_{TOT}$ is calculated as the ratio between the energy actually stored into the accumulator and the energy absorbed altogether by the source from the initial time instant $t_I$ to the final one $t_F$, such final instant being determined by the desired final state of charge of the accumulator at the end of the charging process:

$$\eta_{TOT} = \frac{\sum_{t_K=t_I}^{t_F}[V_{out}(t_K) \cdot I_{out}(t_K) - P_{DA}(t_K)]}{\sum_{t_K=t_I}^{t_F} V_{out}(t_K) \cdot I_{out}(t_K) + \sum_{t_K=t_I}^{t_F} P_{DCH}(t_K)} \quad (14)$$

In some types of applications, it may be useful to determine the relationship between the charging efficiency and the temperature, because both the parameters of the accumulator and those of the charging system may be affected by temperature variations. In such cases, the same reasoning made with regard to the variations of the input voltage can be applied. According to an aspect of the present invention, a pre-determined number of measurements of the equivalent electrical parameters of the accumulator in correspondence to a pre-determined number of different values of the operating temperature $T_A$ of the accumulator can be performed (such measurements may be carried out within just one charging process or possibly in a plurality of different charging processes), and for each circuital element of the equivalent circuit of the accumulator, by interpolation of the above measured values of the electrical parameters, an interpolating function expressing the relationship between the element of the equivalent circuit of the accumulator, the state of charge and the operating temperature of the same accumulator can be obtained. Moreover, a further step of measurements of the efficiency of the charging system in correspondence to a pre-determined number of different values of the operating temperature $T_{CH}$ of the charging system can be performed (even such measurements step can be performed within just one process of characterization or a plurality of different characterization processes), and obtain, by interpolation of the above-mentioned measured values of the charging system efficiency, a function $\eta_{CH}(V_{in}, V_{out}, I_{out}, T_{CH})$ expressing the relationship between the efficiency of the charging system and a generic values quadruple $(V_{in}, V_{out}, I_{out}, T_{CH})$.

Once the above-mentioned relationships between the accumulator electrical parameters, the charging system efficiency and the temperature are known, the following steps can be included in the process of prediction of the energetic efficiency:

a) the initial operating temperature of the accumulator and the charging system are determined before any process of prediction of the energy efficiency;

b) during each process of simulation of the charging process, at each simulation iteration the operating temperature of the accumulator and that of the charging system are determined by means of determined mathematical functions (polynomial, spline, etc.);

c) such values of the operating temperature of the accumulator and of the charging system are used in the determination of the state of charge of the accumulator, the accumulator electrical parameters, voltage and current on the accumulator, the power dissipated by the dissipative elements of the accumulator equivalent circuit and the power dissipated by the charging system utilizing the function $\eta_{CH}(V_{in}, V_{out}, I_{out}, T_{CH})$.

That the proposed characterization method may be implemented by a suitable charging system is another embodiment of the present invention.

Figure 11:
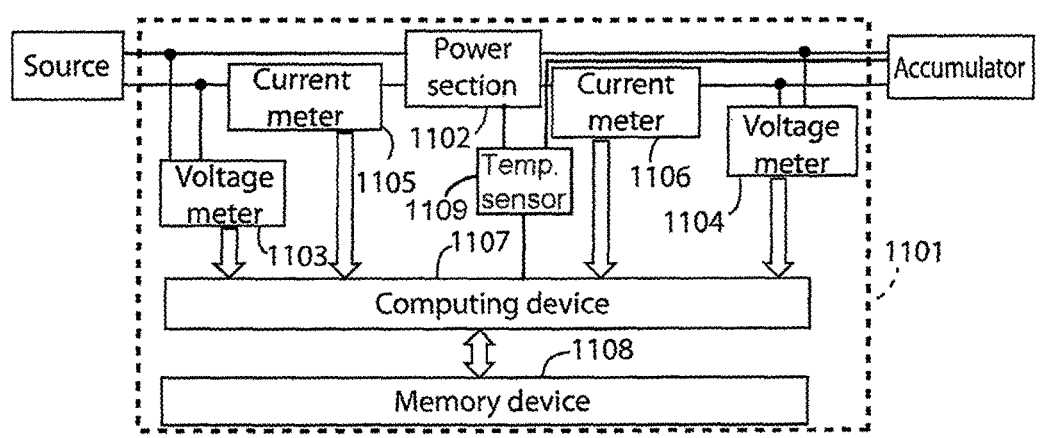
FIG. 11 shows an alternative implementation of the charging system implementing the method proposed according to the invention.

A possible realization of such a system is schematized in FIG. 11. In the system 1101 (as delimited by the dashed line), a power section 1102 is capable of applying suitable voltage waveforms and/or current to the accumulator and supplying electric energy to the accumulator during each charging process. Two voltage meter devices measure the voltage at the input terminals 1103 and output terminals 1104 of the charging system, whilst two current meter devices measure the current flowing in input 1105 and output 1106 to the charging system. These meter devices provide the measured data to a calculation device 1107 which implements the calculations needed by the discussed characterization method, deriving the accumulator electrical parameters and the function for the charging system efficiency. Such data are then sent to a memory storing device 1108 that stores them in order to be subsequently exploited by the calculation device, implementing also the process of prediction of the energetic efficiency.

The discussed system may also include a device (1109 in FIG. 11) for the measurement of the operating temperatures of both the accumulator and the charging system during the charging process. This further information may be also sent to the calculation device to determine the charging efficiency even as a function of the temperature according to the above discussed method.

Figure 13:
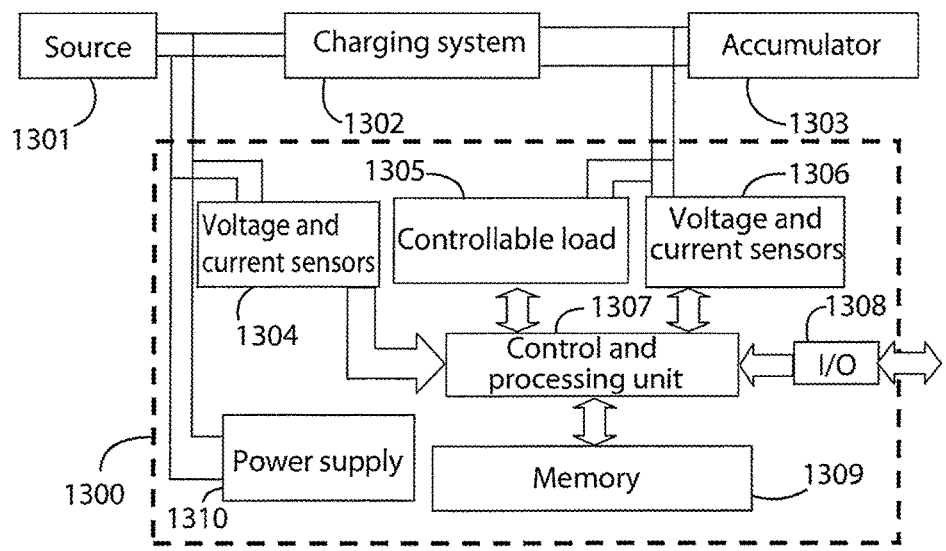
FIG. 13 shows an alternative implementation of the charge control system proposed according to the invention.

In general, the system may also include a device for exchanging data with outside (e.g., at 1308 in FIG. 13). This can allow, for example, the user to fix constraints (maximum charging time, maximum charging current, final state of charge as desired at the end of the process) on the possible time trend of the charging power to be used during the simulation process.

Finally, in another embodiment, the charging system may be utilized to optimize automatically the charging process to obtain the best possible energetic efficiency. In this case, the system carries out a process of prediction of the energetic efficiency before performing a standard charging process. The prediction process consists of the execution of a certain number of simulations, each relevant to a specific time trend of the charging process selected among all the admissible time trends. Therefore, on the basis of the results obtained by the simulations, the system automatically sets the parameters of the power section to optimize the subsequent standard charging process, so as to re-create the time trend of the charging power corresponding to the largest overall charging efficiency value obtained during the above-mentioned process of prediction.

Moreover, the charging system may be implemented also to the end of determining the trend of one or more economic indicators of the energy storage process (such as for example the cost and/or profit relevant to an accumulator charging process and the like) as a function of both the power chosen for the charging process of the accumulator and a possible price plan regime of the energy that varies during the charge. In this case, the time trend of the price of the electric energy may be communicated by devices external to the charging system or determined by prediction models.

According to this last aspect of the invention, it is also possible to implement a system that sets automatically the parameters of the power section to optimize the subsequent standard charging process, to obtain the time trend of the charging power corresponding to the optimal value of the economic indicator at issue obtained during the process of prediction. This can be useful because, in general, the only optimization of the energetic efficiency could not imply automatically the optimization of the economic indicator at issue. For example, it could happen that the time trend of the charging process that allows the maximum energetic efficiency to be obtained also implies the energy purchase during a time slot that is disadvantageous in terms of energy price plan.

As shown, the proposed charging system presents a series of remarkable advantages in comparison with the conventional systems. However, there are several practical situations wherein such a system could not satisfy the needs of users who already have got a charging system. In this case it could happen that the user does not want to substitute the user's own charging system with a new charging system that is able to predict the energetic efficiency of the charging process. To meet these needs, an efficiency measurement system is proposed which is based on a charge control system, to be used in addition to a conventional charging system, and able to implement the proposed method of energetic efficiency characterization.

Figure 12:
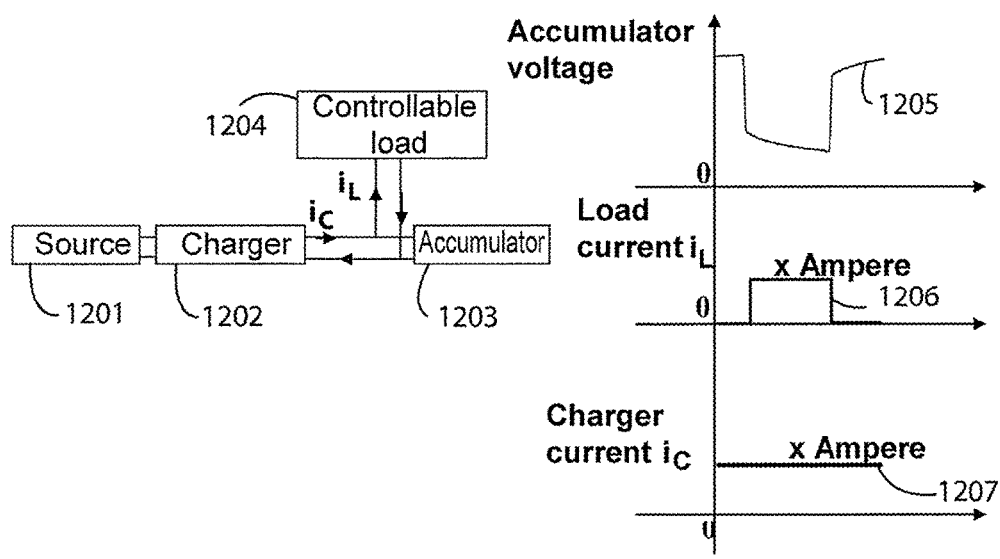
FIG. 12 shows a principle diagram of the functioning of the charge control system proposed according to the invention.

Such a system is based on the idea that, to the end of performing the above steps of determination of parameters provided by the discussed method, it is also possible to apply to the accumulator any current and/or voltage waveform during an accumulator standard charging process, by perturbing the charging process itself for a given timespan without disconnecting the accumulator from the charging system and without altering the functioning of the charging system. The concept is shown in FIG. 12, in a block diagram of the system, wherein a controllable load 1204 is connected in parallel to the accumulator 1203 between the latter and the output of the charging system 1202, the input of which is electrically connected to an electric energy source 1201. When the load is deactivated (the current 1206 flowing at its terminals is null), the accumulator receives the entire current supplied by the charging system 1207, whilst when the load is operated (the current 1206 flowing at its terminals is not null), a part (or the whole) of the current supplied by the charging system is absorbed by the load. This entails a voltage variation at the terminals of the accumulator 1205 that can be used to determine the electrical parameters of the accumulator itself by a suitable calculation algorithm.

On the basis of the foregoing, the quantity of current absorbed by the terminals of the controllable load depends on the particular current and/or voltage waveform to be applied to the accumulator during the steps of determination of the parameters of the accumulator according to the method of the claimed invention. As discussed, in general, in some possible implementations of the characterization method, one could even decide to extract the accumulator electrical parameters by not perturbing the natural voltage and current waveforms applied to the accumulator itself in the standard charging process. In these cases, obviously, the proposed charge control system may be configured to absorb a null current by its terminals during the above-mentioned steps of parameters determination.

In a possible embodiment (FIG. 13), the proposed efficiency measurement system 1300 is directly connected in parallel to the charging system 1302] that is provided with an input section which is electrically connected to an electric energy source 1301, and an output section which is electrically connected to the accumulator 1303.

The proposed charge control system is provided with voltage and current meter devices 1304, 1306 that allow, respectively, the voltage and current at the terminals of the input section and the output section of the charging system to be measured. The one or more current sensors may be realized by resistors placed in series, or in a version wherein the direct connection between the charging system and the accumulator without the interposition of devices in series is guaranteed, can be of inductive type, Hall effect type or the like.

The system is also provided with a controllable load device 1305 that is electrically connected to the output section of the charging system and is able to absorb electric current by its own terminals. Moreover, in a possible implementation, the load device may also supply current.

During an accumulator standard charging process carried out by the charging system, the controllable load device is suitably activated so as to apply a given current and/or voltage waveform to the accumulator to perform the steps of determination of the accumulator parameters as provided by the above discussed efficiency characterization method.

The functioning of the load device is managed by a control and processing device 1307 that activates the load whenever the state of charge is incremented by a pre-determined quantity, and performs the algorithm of determination of the parameters of the accumulator on the basis of the values of voltage and current on the accumulator as measured by the measurement devices.

During the charging process, the control and processing device implements also the step of characterization of the charging system by elaborating, according to the method above discussed, the data coming from the measurement devices and taken during a pre-determined number of measurements steps (the number of such steps depending, as above shown, on the type of implemented characterization method).

The information obtained during the phase of characterization of the energetic efficiency are therefore stored into a suitable memory storing device 1309, and may be made accessible to the outside of the system by a suitable communication device 1308 which allows the data exchange between the measurement system and one or more external devices.

Of course, the storage of the electric parameters makes possible also the calculation of the efficiency outside a characterization process. This is performed by the control and processing device, which may perform at any moment in the lifespan of the system a phase of prediction of the energetic efficiency according to the proposed method, for example to the end of providing the user with useful information on how to carry out the charging process.

The energy needed for the functioning of the elements of the measurement system is provided by a supply section 1310 that can receive energy by a separate source, or the same source from which the charging system takes energy.

In a further implementation of the system, the measurement system may also receive from outside data relevant to the accumulator charging efficiency and/or to the charging system efficiency by the communication device. For example, this can allow initial data coming from a characterization phase performed by the manufacturer of the charging system and/or the accumulator to be inputted into the system. The system may also comprise one or more temperature sensors that allow the operating temperatures of both the accumulator and the charging system to be measured, in order to predict the system energetic efficiency even with varying temperature according to the method above discussed.

The measurement system at issue may be realized in such a way as to be operated from a remote situation, possibly deciding when the accumulator characterization process has to be performed. In a possible implementation of the system, the system can allow also the option of automatic start of the characterization process that can start when the system notices changed conditions. For example, the system may perform a process of absorption (or supply) of a test current, and evaluate whether the electrical parameters obtained from such a process deviates from those that are in the memory storage 1309, and in the affirmative case it may carry out the whole characterization process. Or, according to another aspect of the invention, the system may take into consideration temperature intervals of a certain width, and decide to automatically perform a characterization process whenever, on the basis of the data stored into the storing device, it detects that the current operating temperature falls within a range of temperature wherein a process of characterization has never been performed.

In some cases, the access to the input and/or output terminals of the charging system may be not possible. In such cases, the measurement system may be connected at the input or output by suitable adapters that allow the electrical and mechanical interconnection between the charging system and the charge control system, possibly also without the help of specific equipment and knowledge. In a possible version of the claimed method, such adapter devices have simply an input section and two output sections electrically connected with each other. In another implementation, it is also possible to insert current sensor in series (for example, resistive sensors such as "current shunts") between the various ports of the adapters.

Figure 14:
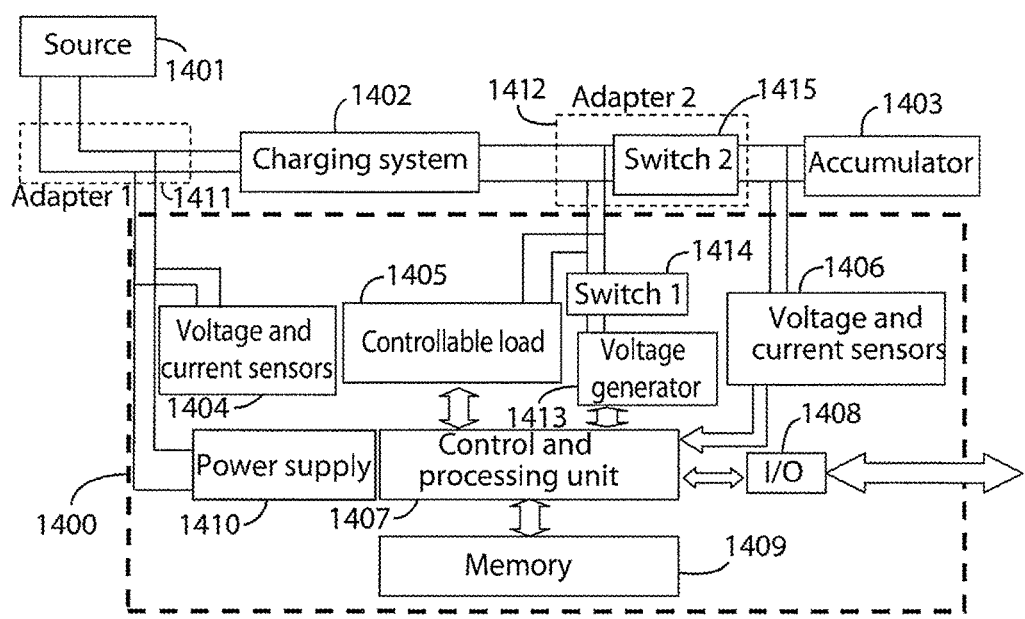
FIG. 14 shows an alternative implementation of the charge control system comprising also a voltage generator, according to the invention.

The different implementations of the charge control system as discussed above are adequate in most part for the practical applications wherein the charging system recognizes the end of the charge by current or temperature measurements, or by using a timer. However, in a limited number of cases (as in some cases of charging systems for NiCd and NiMh batteries), the traditional systems use the so-called ΔV method to recognize the completion of the charging phase of the accumulator. In these cases, the charging is stopped when a negative variation of the voltage of the accumulator is detected. In the cases wherein the charging system utilizes the ΔV method, the adoption of the measurement system as so far described may cause the undesired stop of the charging process because, since part of the current coming from the charging system deviates on the controlled load, a voltage negative variation could occur on the accumulator. To fix this possible problem, a further implementation of the measurement system is proposed (FIG. 14). In this implementation, the system 1400 comprises also a voltage generator device 1413 that is connected by a switching block (switch 1) 1414 to the output section of the charging system 1402, and the accumulator 1403 is connected (adapter 2) at 1412 by another switching block (switch 2) 1415 to the output section of the charging system. In the normal functioning of the charging system, the switch 1 is "open" (the voltage generator is disconnected from the output section of the charging system) and the switch 2 is "closed" (the accumulator is connected to the output section of the charging system). When a current absorption (or supply) process starts by the controllable load 1405, the voltage generator generates a voltage with value equal to the one at the terminals of the accumulator in the time instant preceding the beginning of the absorption (or supply) process, the switch 2 is "open" (the accumulator is disconnected from the output section of the charging system), and the switch 1 is "closed" (the voltage generator is connected to the output section of the charging system) so as to emulate the presence of the accumulator at the output of the charging system.

The functioning of the discussed charge control system is managed by a control and processing unit 1407, configured to realize the method of the present invention.

Similarly to the system of FIG. 13, FIG. 14 also is provided with voltage and current measurement devices 1404, 1406 which allow to measure, respectively, the voltage and current at the terminals of the input and output sections of the charging system. The one or more current sensors can be realized by resistors placed in series or, in a version wherein the direct connection between the charging system and the accumulator without interposition of devices in series is guaranteed, such sensors can be inductive-type, Hall effect-type or the like.

The system may comprise also a storing device 1409 and a communication (I/O) device 1408 that allows the exchange of data between the measurement system and one or more external devices.

The energy needed for the functioning of the elements of the measurement system is supplied by a supply section 1410 that can receive energy from a separate source, or from the same source from which the charging system takes energy.

The system can further comprise an adapter 1411 and an adapter 1412 that allow the electrical and mechanical interconnection between the source 1401, the charging system and the charge control system, possibly also without the help of specific equipment and knowledge.

Figure 15:
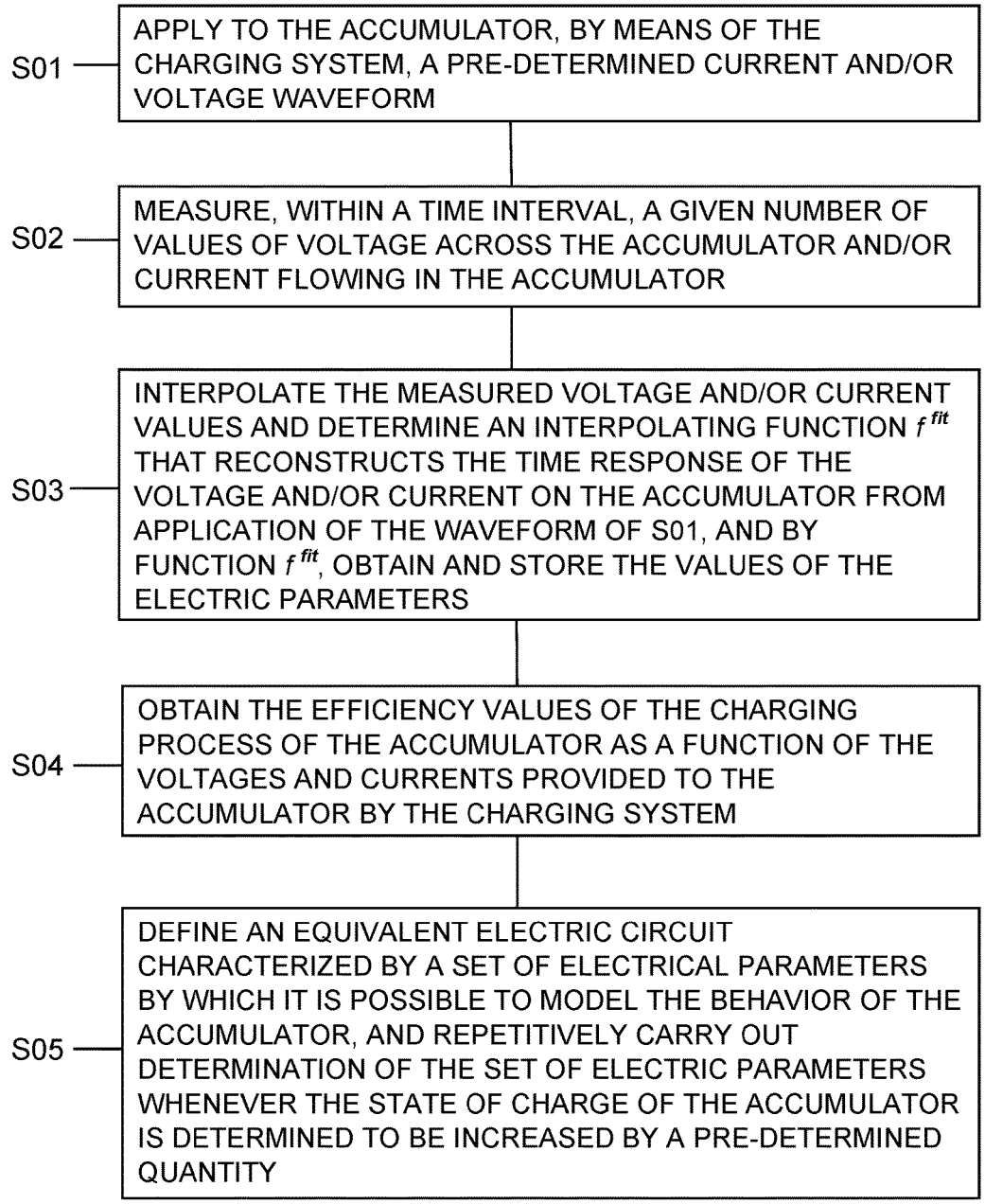
FIG. 15 shows a flow diagram of the steps performed in the present process.

In FIG. 15, step S01 shows the application to the accumulator of any current and/or voltage waveform during an accumulator standard charging process. Such a system is able to perform a charging process of the accumulator and a process of characterization of the energetic efficiency according to the invention as described above, wherein the power section is configured to apply to the accumulator a voltage and/or current waveform according to step A.1.1.

Step S02 shows the measuring, within a time interval of a given number of values of voltage across the accumulator and/or current flowing in the accumulator.

Step S03 shows interpolating the voltage and/or current values measured in step A.1.2, determining an interpolating function $f^{fit}$ that reconstructs the time response of the voltage or current on the accumulator because of the application of the waveform of step A.1.1, and from this function, obtaining and storing the values of the electric parameters.

Step S04 shows obtaining the efficiency values of the charging process of the accumulator as a function of the voltages and currents provided to the accumulator by the charging system.

Step S05 is a defining of an equivalent electric circuit characterized by a set of electrical parameters, by which it is possible to model the behavior of the accumulator, and repetitively carrying out a step of determining the electrical parameters whenever the state of charge of the accumulator comes out to be increased by a pre-determined quantity.

In a further possible implementation, the controllable load device and the voltage generator are implemented by just one device.

Moreover, in each of the discussed implementations, the control and processing device can be implemented even to the end of determining the trend of one or more economic indicators of the energy accumulation as above discussed.

According to the invention, there is given a method for the characterization of the energetic efficiency of the charging process of an accumulator, such a charging process being performed by means of a charging system provided with an input section and an output section and configured to take energy from an energy source by the input section and provide energy to the accumulator by the output section, the above method being performed within at least a charging process of the accumulator and being characterized by the execution of a step A.1 of characterization of the accumulator during at least a charging process and a step A.2 of characterization of the charging system during at least a charging process or at least a different charging process, these steps being performed in sequence or in parallel, for the characterization of the accumulator being performed, the following steps:

A.1) defining an equivalent electric circuit characterized by a set of electrical parameters, by which it is possible to model the behavior of the accumulator, and repetitively carrying out a step of determination of the parameters of the set of electric parameters whenever the state of charge of the accumulator comes out to be increased by a pre-determined quantity, by performing the following sub-steps:

A.1.1) applying to the accumulator, by means of the charging system, a pre-determined current and/or voltage waveform, and A.1.2) measuring, within a time interval, a given number of values of voltage across the accumulator and/or current flowing in the accumulator, and A.1.3) interpolating the above voltage and/or current values measured in step A.1.2, determining an interpolating function $f^{fit}$ that reconstructs the time response of the voltage or current on the accumulator as a consequence of the application of the waveform of step A.1.1, and from this function obtaining and storing the values of the electric parameters;
and for the characterization of the charging system being performed, the following steps:

A.2) calculating a set of values of efficiency of the charging system, measuring voltage $V_{in}$ and current $I_{in}$ at the terminals of the input section and voltage $V_{out}$ and current $I_{out}$ at the terminals of the output section of the charging system, and calculating the ratio between the electric power supplied by the output section as calculated on the basis of $V_{out}$ and $I_{out}$, and the electric power absorbed by the input section as calculated on the basis of $V_{in}$ and $I_{in}$, by means of the following sub-steps:

A.2.1) measuring, during subsequent time intervals wherein the charging system provides a constant charging current $I_{ref}$, a pre-determined number of voltage/current pairs ($V_{out}$, $I_{ref}$) at the output of the charging system and ($T_{in}$, $I_{in}$) at the input of the charging system, deriving the corresponding values of efficiency of the charging system;

A.2.2) determining, by interpolating the efficiency values obtained in step A.2.1, a function $f^n_{V_{out}}$ that provides the values of efficiency of the charging system as a function of a generic voltage $V_{out}$ for current $I_{ref}$ at the output of the charging system;

A.2.3) measuring, during subsequent time intervals wherein the charging system provides a constant output voltage $V_{ref}$, a pre-determined number of voltage/current pairs ($V_{ref}$, $I_{out}$) at the output of the charging system and ($V_{in}$, $I_{in}$) at the input of the charging system, calculating the corresponding values of efficiency of the charging system;

A.2.4) determining, by means of interpolation of the efficiency values of step A.2.3, a function $f^n_{I_{out}}$ providing values of efficiency of the charging system as a function of a generic current $I_{out}$ for voltage $V_{ref}$ at the output of the charging system;

A.2.5) performing an extrapolation step wherein the function $f^n_{V_{out}}$ calculated in step A.2.2 and the function $f^n_{I_{out}}$ calculated in step A.2.4 are used to calculate the values of the efficiency of the charging system $\eta_{CH}$ in correspondence to a generic pair of voltage/current values ($V_{out}$, $I_{out}$) according to a function:

$$\eta_{CH}(V_{out}, I_{out}) = G_{V_{out}}{}^n[f_{I_{out}}{}^n(V_{ref}, I_{out}), V_{out}];$$

wherein $G^n_{V_{out}}$ is a function obtained starting from $f^n_{I_{out}}$ and translating it from its value in correspondence to the pair ($V_{ref}$, $I_{out}$), along the axis defined by the generic value $V_{out}$, of a quantity that is a function of the corresponding increment of $f^n_{V_{out}}$ between $V_{ref}$ and $V_{out}$ when the current at the output of the charging system is equal to $I_{ref}$, for example of a quantity exactly equal to the corresponding increment; thus obtaining the efficiency values of the charging process of the accumulator as a function of the voltages and currents provided to the accumulator by the charging system.

According to an aspect of the invention, the function $f^n_{I_{out}}$ is:

$$f^\eta_{Iout}(V_{ref}, I_{out}) = \frac{V_{ref} \cdot I_{out}}{V_{ref} \cdot I_{out} + P_0(V_{ref}) + \alpha_1(V_{ref}) \cdot I_{out} + \alpha_2(V_{ref}) \cdot I_{out}^2},$$

wherein $P_0(V_{ref})$, $\alpha_1(V_{ref})$ and $\alpha_2(V_{ref})$ are coefficients that assume constant real values for a given value of $V_{ref}$.

According to a further aspect of the invention, the function $G^n_{V_{out}}$ is of type:

$$G_{V_{out}}{}^n[f_{I_{out}}{}^n(V_{ref}, I_{out}), V_{out}] = f_{I_{out}}{}^n(V_{ref}, I_{out}) + \beta_1 \cdot (V_{out} - V_{ref}),$$

wherein $\beta_1$ is a coefficient having a real constant value.

According to an aspect of the invention, step A.2 in at least a charging process or in one or more different charging processes is performed, and wherein the following sub-steps are further carried out:

A.2.6) measuring, during a pre-determined number of subsequent time intervals wherein the charging system receives as input at least a value of voltage $V_{in}$ different with respect to the values of $V_{in}$ as measured during steps A.2.1 and/or A.2.3, a pre-determined number of voltage/current pairs ($V_{out}$, $I_{out}$) at the output of the charging system and ($V_{in}$, $I_{in}$) at the input of the charging system, and calculating the corresponding values of the efficiency of the charging system;

A.2.7) determining, by means of interpolation of the efficiency values determined in step A.2.6, a function $f^n_{V_{in}}$ that provides the values of the efficiency of the charging system as a function of a generic input voltage $V_{in}$, thus obtaining by a method analogous to that of step A.2.5, thanks to the functions $f^n_{V_{out}}$ and $f^n_{I_{out}}$, a function $$\eta_{CH}(V_{in}, V_{out}, I_{out})$$

that allows the value of efficiency of the charging system as a function of the generic triple ($V_{in}$, $V_{out}$, $I_{out}$) to be extrapolated.

According to an aspect of the invention, the function of efficiency of the charging system is:

$$\eta_{CH}(V_{in}, V_{out}, I_{out}) = $$
$$\frac{V_{out} \cdot I_{out}}{V_{out} \cdot I_{out} + K_0 + A_0 V_{in} + B_0 V_{out} + (K_1 + A_1 V_{in} - B_1 V_{out}) I_{out} + (K_2 + A_2 V_{out} - B_2 V_{in}) I_{out}^2},$$

$K_0, K_1, K_2, A_0, A_1, A_2, B_0, B_1, B_2$ being constant coefficients having real values and that can be derived by interpolation of a set of values including:

at least two among the values of efficiency of the charging system measured in step A.2.1, at least two among the values of efficiency of the charging system measured in step A.2.3, at least two among the values of efficiency of the charging system extrapolated by using the function $\eta_{CH}(V_{out}, I_{out})$ of step A.2.5, and at least three among the values of efficiency of the charging system measured in step A.2.6.

According to an aspect of the invention, the following further step are performed, for example, instead of above-mentioned steps A.2.6 and A.2.7:

A.2.8) determining a function $$\eta_{CH}(V_{in}, V_{out}, I_{out})$$

that allows the value of efficiency of the charging system to be extrapolated as a function of the generic triple ($V_{in}$, $V_{out}$, $I_{out}$) by means of an analytic expression, for example the following:

$$\eta_{CH}(V_{in}, V_{out}, I_{out}) = $$

$$\frac{V_{out} \cdot I_{out}}{V_{out} \cdot I_{out} + K_0 + A_0(V_{in} + V_{out}) + [K_1 + A_1(V_{in} - V_{out})]I_{out} + [K_2 + A_2(V_{out} - V_{in})]I_{out}^2},$$

$K_0$, $K_1$, $K_2$, $A_0$, $A_1$, $A_2$ being constant coefficients with real values and that can be derived by interpolation of:
- at least two among the values of efficiency of the charging system measured in step A.2.1,
- at least two among the values of efficiency of the charging system measured in step A.2.3, and
- at least two among the values of efficiency of the charging system extrapolated using the function $\eta_{CH}(V_{out}, I_{out})$ of step A.2.5.

According to an aspect of the invention, the characterization process is carried out within a charging process subdivided into a first charging step wherein the charging system behaves as a current generator and a second charging step wherein the charging system behaves as a voltage generator, step A.2.1 being performed in the first charging step and step A.2.3 being performed in the second charging step.

According to an aspect of the invention, step A.1 and step A.2 are carried out in correspondence to a given number of values of the operating temperature T of the overall system comprising the charging system and accumulator, to the end of characterizing the equivalent circuit and the charging process with varying operating temperature, and determining, by interpolation of the performed measurements, a function $$\eta_{CH}(V_{in}, V_{out}, I_{out}, T)$$

that provides the values of the efficiency of the charging system as a function of a generic values quadruple ($V_{in}$, $V_{out}$, $I_{out}$, T).

According to a different aspect of the invention, step A.1 and step A.2 are executed in correspondence to a given number of values of the operating temperature $T_A$ of the accumulator and the operating temperature $T_{CH}$ of the charging system, to the end of characterizing the charging process with varying operating temperatures of the accumulator and charging system, determining for each electric parameter of the accumulator equivalent circuit, by interpolation of the carried-out measurements, a function providing the value of the electric parameter as a function of the state of charge and accumulator operating temperature $T_A$ and determining, by interpolation of the carried-out measurements, a function $$\eta_{CH}(V_{in}, V_{out}, I_{out}, T_{CH}),$$

providing the values of the efficiency of the charging system as a function of a generic quadruple of values ($V_{in}$, $V_{out}$, $T_{out}$, $T_{CH}$).

According to an aspect of the invention, a method for the prediction of the energetic efficiency of the charging process of an accumulator is given, such a charging process being carried out by a charging system provided with an input section and an output section and suitable to take energy from a source by means of the input section and supply energy to the accumulator by means of the output section, the method utilizing the values of efficiency of the charging system and the electrical parameters of the accumulator equivalent circuit derived by the method according to invention as discussed above, characterized by the execution of the following steps:

B.1) measuring the value of the initial state of charge of the accumulator connected to the charging system, and carrying out the following sub-steps:

B.1.1) carrying out a process of simulation of one or more charging processes, each of such simulated processes being characterized by a given time trend of the charging power, that is defined as the electric power supplied by the accumulator in a given time instant of the charging process, the simulation of each charging process being carried out with a given simulation timestep, determining at each simulation step the corresponding time instant $t_k$, the accumulator state of charge $SOC(t_k)$, the accumulator electrical parameters as a function of $SOC(t_k)$ (since step A.1 obviously allows the values of the electric parameters in correspondence to a finite number of the state of charge to be determined, the value of each parameter in correspondence to any value of $SOC(t_k)$ can possibly be determined by interpolation of the values of the parameters as determined in step A.1), and the voltage $V_{out}(t_k)$ and the current $I_{out}(t_k)$ at the output of the charging system, the power $P_{DA}(t_k)$ dissipated by the accumulator equivalent circuit and the power $P_{DCH}(t_k)$ dissipated by the charging system in correspondence to the pair ($V_{out}(t_k)$, $I_{out}(t_k)$), $P_{DCH}(t_k)$ being calculated utilizing one of the efficiency functions of the charging system as obtained in steps A.2.5, A.2.7 and A.2.8 of the method of the invention as described above, and B.1.2) on the basis of the above values obtained at each simulation timestep, calculating for each simulated charging process the relationship:

$$\eta_{TOT} = \frac{\sum_{t_K=t_I}^{t_F} [V_{out}(t_K) \cdot I_{out}(t_K) - P_{DA}(t_K)]}{\sum_{t_K=t_I}^{t_F} V_{out}(t_K) \cdot I_{out}(t_K) + \sum_{t_K=t_I}^{t_F} P_{DCH}(t_K)}$$

for providing the overall efficiency of the charging process $\eta_{TOT}$ as the ratio between the energy actually stored in the accumulator and the energy that has been absorbed from the source altogether from the initial time instant $t_I$ to the final time instant $t_F$, such final time instant being determined by the desired value of the final charge state of the accumulator at the end of the charging process.

According to an aspect of the invention, the following further steps are executed:
- determining the initial operating system temperature before each process of prediction of energetic efficiency, and
- during each process of simulation of the charging process, determining at each step the system operating temperature $T(t_K)$ by means of a pre-determined function of the power dissipated by the accumulator and charging system, and utilizing these values of the system operating temperature $T(t_K)$ for the determination of the state of charge of the accumulator $SOC(t_k)$, of the accumulator electrical parameters as a function of $SOC(t_k)$, of both the voltage $V_{out}(t_k)$ and the current $I_{out}(t_k)$ outputting the charging system, of the power $P_{DA}(t_k)$ dissipated by the dissipative elements of the equivalent circuit of the accumulator and of the power $P_{DCH}(t_k)$ dissipated by the charging system, by using the function $$\eta_{CH}(V_{in}, V_{out}, I_{out}, T)$$

determined according to the method of the invention.

According to a different aspect of the invention, the following steps are performed:

determining the initial operating temperature of the accumulator and the charging system before each prediction process of the energy efficiency, and during each process of simulation of the charging process, determining at each step the operating temperature of the accumulator $T_A(t_K)$ and the charging system $T_{CH}(t_K)$ by pre-determined functions of the power dissipated by the accumulator and the charging system, and utilizing such values of the accumulator operating temperature $T_A(t_K)$ and the charging system $T_{CH}(t_K)$ in the determination of the state of charge of the accumulator $SOC(t_k)$, of the electric parameters of the accumulator as a function of both $SOC(t_k)$ and $T_A(t_K)$ by the functions determined according to the method of the invention as above, of both the voltage $V_{out}(t_k)$ and the current $I_{out}(t_k)$ outputting the charging system, of the power $P_{DA}(t_k)$ dissipated by the dissipative elements of the equivalent circuit of the accumulator and of the power $P_{DCH}(t_k)$ dissipated by the charging system by the function $$\eta_{CH}(V_{in}, V_{out}, I_{out}, T_{CH})$$

determined according to the method as above.

According to an aspect of the invention, the value of at least an economic indicator relevant to energy storage is further determined, such as for example the cost relevant to an accumulator charging process, by the method further comprising the execution of the following steps:

determining a function m(t) that provides the relationship between the electric energy rate and the charging time t;

determining a function c[m(t)] that provides the relationship between the at least an economic indicator and the electric energy rate at a given time instant;

at each step of each simulation process carried out during the process of energetic efficiency prediction, determining also the value $c[m(t_K)]$ of the at least an economic indicator and, on the basis of the values obtained at each simulation timestep, calculating the final value $c_F$ of such at least an economic indicator at the end of the charging process according to the relationship $$c_F = \sum_{t_K = t_I}^{t_F} c[m(t_K)].$$

According to an aspect of the present invention, a charging system is provided for electric energy accumulators, such system being provided with an output section and an input section and being able to take up energy from a source by means of the input section and supply it to the accumulator by means of the output section, such system comprising the following elements:

a power section able to supply electric energy to the accumulator and to apply to it a pre-determined voltage and/or current waveform, an output voltage measurement device for the measurement of the voltage at the terminals of the charging system output section, an output current measurement device for the measurement of the current that flows through the terminals of the charging system output section, an input voltage measurement device for the measurement of the voltage at the terminals of the charging system input section, an input current measurement device for the measurement of the current flowing through the terminals of the charging system input section, a memory device, and an electronic calculation device, such a system being able to perform a charging process of the accumulator and a process of characterization of the energetic efficiency according to the invention as described above, wherein:

the power section is configured to apply to the accumulator a voltage and/or current waveform according to step A.1.1;

the output voltage measurement device, the input voltage measurement device, the input current measurement device and the output current measurement device perform the measurements of steps A.1.2, A.2.1, A.2.3;

the electronic calculation device performs the calculations of steps A.1.3 and from A.2.1 to A.2.5; and the memory device is used to retrievably store the data calculated by the method.

According to an aspect of the present invention, the charging system further performs, by the included devices, the steps of the method for the characterization of the energetic efficiency of the charging process of an accumulator as described above.

According to an aspect of the present invention, the system described above further comprises a temperature measurement device, which is configured for the execution of the temperature measurements discussed above.

According to an aspect of the present invention, the calculation device is configured to execute a process of energy efficiency prediction according to the method for the prediction of the energetic efficiency of the charging process of an accumulator of the invention, as discussed above.

According to an aspect of the present invention, the electronic calculation device performs a process of energetic efficiency prediction before performing a charging process, and sets up automatically the functioning parameters of the power section to carry out the charging process, ensuring the time trend of the charging power corresponding to the largest value of overall efficiency $\eta_{TOT}$ obtained during a process of prediction of the energetic efficiency, or corresponding to the smallest value of the economic indicator $c_F$ calculated according to the invention as above specified.

According to an aspect of the present invention, a charging control system is provided for an electric energy accumulator that receives energy from a battery charger, which includes an input section and an output section and is able to take energy from a source by means of the input section and supply it to the accumulator by means of the output section presenting two terminals, the charging control system being characterized in that it comprises two control terminals suitable to be connected, directly or by means of one or more devices in series, to the two terminals of the output section of the battery charger, and comprises:

a load device configured to draw and/or supply electric current by the two control terminals during pre-defined time intervals within a charging process carried out by the above-mentioned battery charger, in such a way that a pre-determined current and/or voltage waveform comes out to be applied to the accumulator, according to step A.1.1 of the method as described above;

at least a voltage sensing device that measures the voltage difference between the terminals of the output section of the battery charger and/or the voltage difference between the terminals of the accumulator;

at least a current sensing device that measures the current flowing into the terminals of the output section of the battery charger;

at least a voltage sensing device that measures the voltage difference between the terminals of the input section of the battery charger, and at least a current sensing device that measures the current flowing into the terminals of the input section of the battery charger;

sensing devices being configured to perform the measurements of the steps of the method according to the invention described above, as well as:

at least a memory device that allows the storage of the measurement data; and an electronic control and processing device;

configured to carry out the calculations and/or simulations according to the steps of the method according to the present invention.

According to an aspect of the present invention, there are also one or more temperature sensing devices that measure the accumulator operating temperature and the charging system operating temperature.

According to an aspect of the present invention, the system comprises at least a switching block connected in series between the terminals of the output section of the battery charger and the terminals of the accumulator, such a switching block being controlled by the electronic control and processing device in such a way to electrically disconnect the accumulator from the output section of the battery charger during the time intervals wherein the load device draws or supplies current, and to electrically connect the accumulator to the output section of the battery charger in the remaining time intervals, the system further comprising the following elements:

a voltage generator provided with two terminals suitable to be electrically connected, directly or by one or more devices in series, to the terminals of the battery charger output section, the voltage generator being able to establish a voltage difference between its terminals, such voltage difference being determined by the electronic control and processing device;

at least a switching block connected in series between the terminals of the above voltage generator and the terminals of the output section of the battery charger, such switching block being controlled by the electronic control and processing device in such a way to electrically connect the voltage generator to the output section of the battery charger during the time intervals wherein the load device draws or supplies current, and to electrically disconnect the voltage generator from the output section of the battery charger in the remaining time intervals.

According to an aspect of the present invention, the system further comprises a power section suitable to supply current by the two control terminals.

The overall method consists of two fundamental steps, the first of which may also be performed alone. The first step is the implementation of an innovative process of characterization of the energetic efficiency carried out during a charging process of the accumulator. By means of such a process of characterization of the energetic efficiency, a series of information is obtained concerning:

the dependency of the electric parameters of the accumulator on the state of charge and possibly also on the accumulator operating temperature; and the dependency of the efficiency of the charging system on the voltage and current at the terminals of the output section of the charging system, and possibly also on the voltage at the terminals of the input section of the charging system and the operating temperature of the charging system.

The second step of the proposed method is the implementation of a process of numerical processing of the data for the prediction of the energetic efficiency, which consists of carrying out the simulation of one or more charging processes characterized by a given time trend of the charging power on the basis of the initial conditions of the system (in terms of initial state of charge and possibly initial operating temperature) in the given instant wherein the simulation is performed.

According to an aspect of the present invention, the proposed method is realized by a suitable charging system able to perform both a standard charging process of the accumulator and a process of characterization of the energetic efficiency, as well as a process of prediction of the energetic efficiency, according to the appended claims.

According to another aspect of the present invention, a charge control system is also proposed that can be used jointly with a conventional charging system to implement a process of characterization of the energetic efficiency during a standard charging process of the accumulator, and the possible subsequent step of numerical processing of the data for the prediction of the energetic efficiency, according to the appended claims.

BIBLIOGRAPHY

[1] Er et al., "Method for calculating the efficiency of an energy store, and use of said efficiency", Patent US 2011/0035084.

[2] De Koning et Al., "Modeling battery efficiency with parallel branches", IEEE Power Electronics Specialists Conference 2004.

[3] Arai et al., "Apparatus and method for detecting fully charged condition, apparatus and method for detecting charged condition, and apparatus and method for determining degree of degradation", Patent US 2006/0273761.

[4] T. Morita et al., "Battery measuring device, battery control system and vehicle", Patent US 2010/0250038, September 2010.

[5] T. Okada, "Method of calculating rechargeable battery charge capacity", U.S. Pat. No. 5,789,924, August 1998.

[6] E. Barsoukov et al., "Circuit and method for determining battery impedance increase with aging", U.S. Pat. No. 6,832,171, December 2004.

[7] Bertness, "Monitor for front terminal batteries", Patent no WO 2011/109343, September 2011.

[8] Paryani, "Determining Battery DC Impedance", Patent: US 2011/0077879.

[9] Chapuis, "Apparatus and method of optimizing power system efficiency using a power loss model", Patent: US 2009/0296432.

[10] Bose et al., "Active electrical power flow control system for optimization of power delivery in electric hybrid vehicles", Patent no US 2009/0309416, December 2009.

Embodiments have been above described and some modifications of this invention have been suggested, but it should be understood that those skilled in the art can make variations and changes without departing from the related scope of protection, as defined by the following claims.

What is claimed is:

1. A charging system for an electric energy accumulator, said charging system comprising an input section and an output section, the input section being configured to take in energy from a source and the output section being configured to supply energy to the accumulator, the system further comprising:
a power section supplying electric energy to the accumulator and applying to the accumulator, at least one of,
a pre-determined voltage and current waveform,
a set of devices including:
an output voltage measurement device configured to measure voltage at terminals of the output section of the charging system,
an output current measurement device configured to measure electrical current flowing through the terminals of the output section of the charging system,
an input voltage measurement device configured to measure voltage at terminals of the input section,
an input current measurement device configured to measure electrical current flowing through the terminals of the input section,
a memory device, and
an electronic calculation device,
the charging system performing a charging process of the accumulator and a process of characterization of the accumulator and of the efficiency of the charging system, wherein:
the charging process performed by the charging system taking energy from the source by the input section and providing energy to the accumulator by the output section, the characterization of the accumulator and of efficiency of the charging system being performed within at least a charging process of the accumulator, and being characterized by execution of a step A.1 of characterization of the accumulator during said at least a charging process and a step A.2 of characterization of the charging system during said at least a charging process or at least a different charging process, wherein steps A.1 and A.2 are performed in sequence or in parallel, and wherein the characterization of the accumulator is performed by the following:
A.1) defining an equivalent electric circuit characterized by a set of electrical parameters, modeling a behavior of the accumulator, and repetitively carrying out a determination of said set of electrical parameters whenever a state of charge of the accumulator is increased by a pre-determined quantity, by performing the following:
A.1.1) applying to the accumulator, by way of the charging system, at least one of, a pre-determined current and voltage waveform;
A.1.2) measuring, within a time interval, a number of values of voltage across the electric energy accumulator and/or current flowing in the electric energy accumulator,
A.1.3) interpolating the values of voltage and/or current measured in step A.1.2, determining an interpolating function $f^{fit}$ that reconstructs a time response of voltage or current on the electric energy accumulator because of an application of the at least one of, a predetermined current and voltage waveform of step A.1.1, and obtaining and storing the values of said set of electrical parameters;
and for the characterization of the charging system being performed by the following:
A.2) calculating a set of values of efficiency of the charging system, measuring a voltage $V_{in}$ and a current $I_{in}$ at the terminals of the input section, measuring a voltage $V_{out}$ and a current $I_{out}$ at the terminals of the output section of the charging system, and calculating the ratio between the electric power supplied by the output section of the charging system as calculated on the basis of $V_{out}$ and $I_{out}$, and the electric power absorbed by the input section as calculated on the basis of $V_{in}$ and $I_{in}$, by way of performing the following:
A.2.1) during time intervals when the charging system provides a constant charging current $I_{ref}$, measuring a pre-determined number of voltage and current pairs $(V_{out}, I_{ref})$ at the output section of the charging system and $(V_{in}, I_{in})$ at the input section of the charging system, and deriving the corresponding values of efficiency of the charging system;
A.2.2) determining, by interpolating the values of efficiency obtained in step A.2.1, a function $f^n{}_{Vout}$ that provides the values of efficiency of the charging system as a function of a generic voltage $V_{out}$ for said current $I_{ref}$ at the output section of the charging system;
A.2.3) during subsequent time intervals when the charging system provides a constant output voltage $V_{ref}$, measuring a pre-determined number of voltage and current pairs $(V_{ref}, I_{out})$ at the output section of the charging system, and $(V_{in}, I_{in})$ at the input section of the charging system, and calculating the corresponding values of efficiency of the charging system;
A.2.4) determining, by interpolation of the values of efficiency of step A.2.3, a function $f^n{}_{Iout}$ providing values of efficiency of the charging system as a function of a generic current $I_{out}$ for said voltage $V_{ref}$ at the output section of the charging system;
A.2.5) performing an extrapolation step wherein the function $f^n{}_{Vout}$ calculated in step A.2.2 and the function $f^n{}_{Iout}$ calculated in step A.2.4 are used to calculate the values of the efficiency of the charging system $\eta_{CH}$ in correspondence of a generic pair of voltage and current values $(V_{out}, I_{out})$ according to a function:

$$\eta_{CH}(V_{out}, I_{out}) = G_{Vout}{}^n [f_{Iout}{}^n (V_{ref}, I_{out}), V_{out}];$$

wherein $G^n{}_{out}$ is a function obtained starting from $f^n{}_{Iout}$ and translating a value of the function starting from $f^n{}_{Iout}$ in correspondence of the pair $(V_{ref}, I_{out})$, along an axis defined by the generic value $V_{out}$, of a quantity that is a function of the corresponding increment of $f^n{}_{Vout}$ between $V_{ref}$ and $V_{out}$ when a calculated current at the output section of the charging system is equal to $I_{ref}$, of a quantity exactly equal to said increment;
thus, obtaining the values of efficiency of the at least a charging process of the accumulator as a function of the voltages and currents provided to the accumulator by the charging system,
wherein the memory device stores data calculated by the process; and
wherein the electronic calculation device performs a process of efficiency prediction before performing each charging process subsequent to the characterization of the accumulator and of the efficiency of the charging system, and sets up automatically functioning parameters of the power section to charge the electric energy accumulator according to the functioning parameters, so that a time trend of the charging power corresponding to the largest value of overall efficiency $\eta_{TOT}$ obtained during said process of efficiency prediction, or corresponding to achieving the smallest value of an economic indicator $C_F$, and the charging system charges with an improved electric energy accumulator setting.

2. The charging system according to claim 1, wherein said charging system further performs, by the set of devices:

A.2.6) measuring, during a pre-determined number of subsequent time intervals when the charging system receives as input at least a value of voltage $V_{in}$ different with respect to the values of $V_{in}$ as measured during at least one of, steps A.2.1 and A.2.3, a pre-determined number of voltage and current pairs ($V_{out}$, $I_{out}$) at the output section of the charging system and ($V_{in}$, $I_{in}$) at the input section of the charging system, calculating the corresponding values of the efficiency of the charging system; and A.2.7) determining, by way of interpolation of the values of efficiency determined in step A.2.6, a function $f^n{}_{Vin}$ that provides the values of the efficiency of the charging system as a function of a generic input voltage $V_{in}$, and obtaining by a method analogous to that of step A.2.5, using the functions $f^n{}_{Vout}$ and $f^n{}_{Iout}$, a function $$\eta_{CH}(V_{in}, V_{out}, I_{out}),$$

and extrapolating a value of efficiency of the charging system as a function of a generic triple ($V_{in}$, $V_{out}$, $I_{out}$).

3. The charging system according to claim 2, further comprising:

A.2.8) determining a function $\eta_{CH}(V_{in}, V_{out}, I_{out})$ and extrapolating the value of efficiency of the charging system as a function of the generic triple ($V_{in}$, $V_{out}$, $I_{out}$) using the following analytic expression:

$$\eta_{CH}(V_{in}, V_{out}, I_{out}) == \frac{V_{out} \cdot I_{out}}{V_{out} \cdot I_{out} + K_0 + A_0(V_{in} + V_{out}) + [K_1 + A_1(V_{in} - V_{out})]I_{out} + [K_2 + A_2(V_{out} - V_{in})]I_{out}^2}$$

$K_0$, $K_1$, $K_2$, $A_0$, $A_1$, $A_2$ being constant coefficients with real values and that can be derived by interpolation of:
at least two among the values of efficiency of the charging system measured in step A.2.1,
at least two among the values of efficiency of the charging system measured in step A.2.3, and
at least two among the values of efficiency of the charging system extrapolated using the function $\eta_{CH}(V_{out}, I_{out})$ of step A.2.5.

4. The charging system according to claim 1, further comprising a temperature measurement device configured to execute temperature measurements, wherein the step A.1 and the step A.2 are carried out by the set of devices, in correspondence of a number of values of an operating temperature T of the charging system and the accumulator, toward an end of characterizing the equivalent circuit and the charging process with varying operating temperature, determining, by interpolation of the performed measurements, a function $$\eta_{CH}(V_{in}, V_{out}, I_{out}, T)$$

that provides the values of the efficiency of the charging system as a function of a generic values quadruple ($V_{in}$, $V_{out}$, $I_{out}$, T).

5. The charging system according to claim 1, wherein the process of energy efficiency prediction of the accumulator is carried out by a charging system provided with an input section and an output section and suitable to take energy from a source by way of the input section and supply energy to the accumulator by way of the output section of the charging system, the method utilizing the values of efficiency of the charging system and the electrical parameters of the accumulator equivalent circuit, comprising:

B.1 measuring the value of the initial state of charge of the accumulator connected to the charging system, and carrying out the following:

B.1.1) carrying out a process of simulation of at least one charging process, each of the simulated charging processes being characterized by the time trend of the charging power, that is defined as the electric power supplied to the accumulator in a time instant of the charging process, the simulation of each charging process being carried out with a simulation timestep, determining at each simulation step the corresponding time instant $t_k$, the accumulator state of charge $SOC(t_k)$, the accumulator electrical parameters as a function of $SOC(t_k)$, the voltage $V_{out}(t_k)$ and the current $I_{out}(t_k)$ at the output section of the charging system, the power $P_{DA}(t_k)$ dissipated by the accumulator equivalent circuit and the power $P_{DCH}(t_k)$ dissipated by the charging system in correspondence of the pair ($V_{out}(t_k)$, $I_{out}(t_k)$), $P_{DCH}(t_k)$ being calculated utilizing an efficiency function of the charging system, and B.1.2) based on the above values obtained at each simulation timestep, calculating the relationship:

$$\eta_{TOT} = \frac{\sum_{t_K=t_I}^{t_F}[V_{out}(t_K) \cdot I_{out}(t_K) - P_{DA}(t_K)]}{\sum_{t_K=t_I}^{t_F} V_{out}(t_K) \cdot I_{out}(t_K) + \sum_{t_K=t_I}^{t_F} P_{DCH}(t_K)}$$

providing the overall efficiency of the charging process $\eta_{TOT}$ as the ratio between the energy actually stored in the accumulator and the energy that has been absorbed from the source altogether from the initial time instant $t_I$ to the final time instant $t_F$, said final time instant being determined by the desired value of the final charge state of the accumulator at the end of the charging process.

6. The charging system according to claim 1, wherein said charging system further performs, by the set of devices:

A.2.8) determining a function $\eta_{CH}(V_{in}, V_{out}, I_{out})$ and extrapolating the value of efficiency of the charging system as a function of the generic triple ($V_{in}$, $V_{out}$, $I_{out}$) by way of the following analytic expression:

$$\eta_{CH}(V_{in}, V_{out}, I_{out}) == \frac{V_{out} \cdot I_{out}}{V_{out} \cdot I_{out} + K_0 + A_0(V_{in} + V_{out}) + [K_1 + A_1(V_{in} - V_{out})]I_{out} + [K_2 + A_2(V_{out} - V_{in})]I_{out}^2}$$

$K_0$, $K_1$, $K_2$, $A_0$, $A_1$, $A_2$ being constant coefficients with real values and that can be derived by interpolation of:
at least two among the values of efficiency of the charging system measured in step A.2.1,
at least two among the values of efficiency of the charging system measured in step A.2.3, and
at least two among the values of efficiency of the charging system extrapolated using the function $\eta_{CH}(V_{out}, I_{out})$ of step A.2.5.

7. The charging system according to claim 1, wherein said charging system further performs, by the set of devices, the characterization process within a charging process subdivided into a first charging step wherein the charging system behaves as a current generator and a second charging step wherein the charging system behaves as a voltage generator, the step A.2.1 being performed in said first charging step and the step A.2.3 being performed in said second charging step.

8. The charging system according to claim 5, wherein step A.2 is performed in said at least a charging process, or at least a different charging process and further comprising:
   A.2.6) measuring, during a pre-determined number of subsequent time intervals wherein the charging system receives as input at least a value of voltage $V_{in}$ different with respect to the values of $V_{in}$ as measured during at least one of, the steps A.2.1 and A.2.3, a pre-determined number of voltage and current pairs ($V_{out}$, $I_{out}$) at the output section of the charging system and ($V_{in}$, $I_{in}$) at the input section of the charging system, calculating the corresponding values of the efficiency of the charging system; and
   A.2.7) determining, by way of interpolation of the values of efficiency determined in step A.2.6, a function $f^n{}_{Vin}$ that provides the values of the efficiency of the charging system as a function of a generic input voltage $V_{in}$, thus obtaining by a method analogous to that of step A.2.5, using the functions $f^n{}_{Vout}$ and $f^n{}_{Iout}$, a function $\eta_{CH}$ ($V_{in}$, $V_{out}$, $I_{out}$) and extrapolating the value of efficiency of the charging system as a function of the generic triple ($V_{in}$, $V_{out}$, $I_{out}$).

9. The charging system according to claim 5, wherein step A.1 and step A.2 are carried out in correspondence of a number of values of the operating temperature T of an overall system comprising the charging system and the accumulator, toward an end of characterizing the equivalent circuit and the charging process with varying operating temperature, and determining, by interpolation of the performed measurements, a function $\eta_{CH}(V_{in}, V_{out}, I_{out}, T)$ that provides the values of the efficiency of the charging system as a function of a generic values quadruple ($V_{in}$, $V_{out}$, $I_{out}$, T).

10. The charging system according to claim 9, further comprising:
   determining an initial operating system temperature before the process of energy prediction efficiency, and during a process of simulation of the charging process, determining at each step the system operating temperature $T(t_K)$ by way of a pre-determined function of power dissipated by the accumulator and charging system, and utilizing this value of the system operating temperature $T(t_k)$ for determining the state of charge of the accumulator $SOC(t_k)$, of the accumulator electrical parameters as a function of $SOC(t_k)$, of both voltage $V_{out}(t_k)$ and current $I_{out}(t_k)$ outputting the charging system, of the power $P_{DA}(t_k)$ dissipated by the dissipative elements of the equivalent circuit of the accumulator and of the power $P_{DCH}(t_k)$ dissipated by the charging system, by using the function $\eta_{CH}(V_{in}, V_{out}, I_{out}, T)$.

11. The charging system according to claim 5, wherein a value of at least an economic indicator relevant to energy storage is further determined by:
   determining a function m(t) that provides the relationship between the electric energy rate and the charging time t;
   determining a function c[m(t)] that provides the relationship between said at least an economic indicator and the electric energy rate at a time instant;
   at each step of each simulation process carried out during the process of energy efficiency prediction, determining also the value $c[m(t_K)]$ of said at least an economic indicator, and, using said values obtained at each simulation timestep, calculating the final value $c_F$ of such at least an economic indicator at the end of the charging process according to the relationship $$c_F = \sum_{t_K=t_I}^{t_F} c[m(t_K)].$$

12. The charging system according to claim 11, wherein the electronic calculation device performs a process of energy efficiency prediction before performing a charging process, and sets up automatically the functioning parameters of the power section to carry out the charging process, wherein the time trend of the charging power corresponds to the largest value of overall efficiency $\eta_{TOT}$ obtained during said process of prediction of the energy efficiency, or corresponding to the smallest value of the economic indicator $c_F$ calculated according to the relationship $$c_F = \sum_{t_K=t_I}^{t_F} c[m(t_K)].$$

13. The charging system according to claim 11, wherein the value of at least an economic indicator relevant to energy storage is the cost relevant to an electric energy accumulator charging process.

14. System according to claim 8, further comprising:
   A.2.8) determining a function $\eta_{CH}(V_{in}, V_{out}, I_{out})$ and extrapolating the value of efficiency of the charging system as a function of the generic triple ($V_{in}$, $V_{out}$, $I_{out}$) by using the following analytic expression:

$$\eta_{CH}(V_{in}, V_{out}, I_{out}) = \frac{V_{out} \cdot I_{out}}{V_{out} \cdot I_{out} + K_0 + A_0(V_{in} + V_{out}) + [K_1 + A_1(V_{in} - V_{out})]I_{out} + [K_2 + A_2(V_{out} - V_{in})]I_{out}^2}$$

$K_0$, $K_1$, $K_2$, $A_0$, $A_1$, $A_2$ being constant coefficients with real values and that can be derived by interpolation of:
   at least two among the values of efficiency of the charging system measured in step A.2.1,
   at least two among the values of efficiency of the charging system measured in step A.2.3, and
   at least two among the values of efficiency of the charging system extrapolated using the function $\eta_{CH}(V_{out}, I_{out})$ of step A.2.5.

* * * * *